(12) United States Patent
Ishibashi et al.

(10) Patent No.: US 8,092,703 B2
(45) Date of Patent: Jan. 10, 2012

(54) MANUFACTURING METHOD OF SEMICONDUCTOR DEVICE

(75) Inventors: Takeo Ishibashi, Tokyo (JP); Kazumasa Yonekura, Tokyo (JP); Masahiro Tadokoro, Tokyo (JP); Kazunori Yoshikawa, Tokyo (JP); Yoshiharu Ono, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 824 days.

(21) Appl. No.: 11/808,650

(22) Filed: Jun. 12, 2007

(65) Prior Publication Data

US 2007/0287298 A1 Dec. 13, 2007

(30) Foreign Application Priority Data

Jun. 12, 2006 (JP) ................. 2006-162226

(51) Int. Cl.
| | |
|---|---|
| C03C 15/00 | (2006.01) |
| C03C 25/68 | (2006.01) |
| C23F 1/00 | (2006.01) |
| H01L 21/302 | (2006.01) |
| H01L 21/461 | (2006.01) |

(52) U.S. Cl. ............. 216/41; 216/48; 438/706; 438/717
(58) Field of Classification Search ........................ None
See application file for complete search history.

(56) References Cited

U.S. PATENT DOCUMENTS

| | | | | |
|---|---|---|---|---|
| 6,593,659 | B2 * | 7/2003 | Yokoyama | ............. 257/774 |
| 6,716,571 | B2 * | 4/2004 | Gabriel et al. | ............. 430/313 |
| 6,743,713 | B2 * | 6/2004 | Mukherjee-Roy et al. | ... 438/638 |
| 2004/0256357 | A1 * | 12/2004 | Edelberg et al. | ................ 216/67 |
| 2006/0089005 | A1 * | 4/2006 | Kanarik et al. | ............... 438/714 |

FOREIGN PATENT DOCUMENTS

| | | | |
|---|---|---|---|
| JP | 2001-358061 A | | 12/2001 |
| JP | 2002270584 A | * | 9/2002 |
| JP | 2002-329648 A | | 11/2002 |
| JP | 2005-535936 A | | 11/2005 |

OTHER PUBLICATIONS

Krishnaswamy et al, Soft Vacuymm Pulsed Electron-Beam Hardening of Lithographic Polymers, Dec. 1988, Journal of Material Science, pp. 1259-1267.*

(Continued)

*Primary Examiner* — Nadine G Norton
*Assistant Examiner* — Stephanie Duclair
(74) *Attorney, Agent, or Firm* — McDermott Will & Emery LLP

(57) ABSTRACT

It is an object of the present invention to provide a method of manufacturing a semiconductor device that reduces the deterioration in processed configuration and the pattern roughness of a film to be processed, and is close to the original design and applicable to a dual damascene step and the like. The manufacturing method comprises a processing mask layer forming step of forming a processing mask layer (a lower organic film and a middle layer) comprising at least one film, and hardening treatment for at least one film of the processing mask layer by applying a film and heat hardening treatment; a processing mask layer etching step of applying a resist film for exposure to the processing mask layer, exposing and developing it to form a resist pattern, and etching the processing mask layer using the resist pattern as a mask; and a film to be processed etching step of etching the film to be processed using the pattern of the processing mask layer formed at the processing mask layer etching step as a mask.

18 Claims, 17 Drawing Sheets

OTHER PUBLICATIONS

OUCHI JP 2002-270584 Machine Translation.*

Mahorowala etl al, Line Edge Roughness Reduction by Plasma Curing Photoresists, 2005, Advances in Resist Technology and Processing XXII, vol. 5753, pp. 380-389.*

Yamaguchi et al, Ar Ion Implantation into Resist for Etching Resistance Improvement, 2001, Advances in Resist Technology and Processing XVIIII, vol. 4345, pp. 655-664.*

Mahorowala, Arpan et al. "Line edge roughness reduction by plasma curing photoresist," Advances in Resist Technology and Processing XXII, Proc. SPIE vol. 5753, 2005, pp. 380-389.

Yamaguchi, Atsumi et al., "Ar Ion Implantation into Resist for Etching Resistance Improvement," Advances in Resist Technology and Processing XVIII, Proc. SPIE vol. 4345, 2001, pp. 655-664.

Ercken et al., *Effect of Different Processing Conditions on Line Edge Roughness for 193 nm and 157 nm Resists*, Proc. of SPIE vol. 5375, pp. 266-275.

Shinohara et al., *Impact of Ar Ion Implantation Into Spin-on Carbon Hardmask for Fine Patterning*, 2007 Dry Process International Symposium, pp. 151-152.

* cited by examiner

F I G . 8
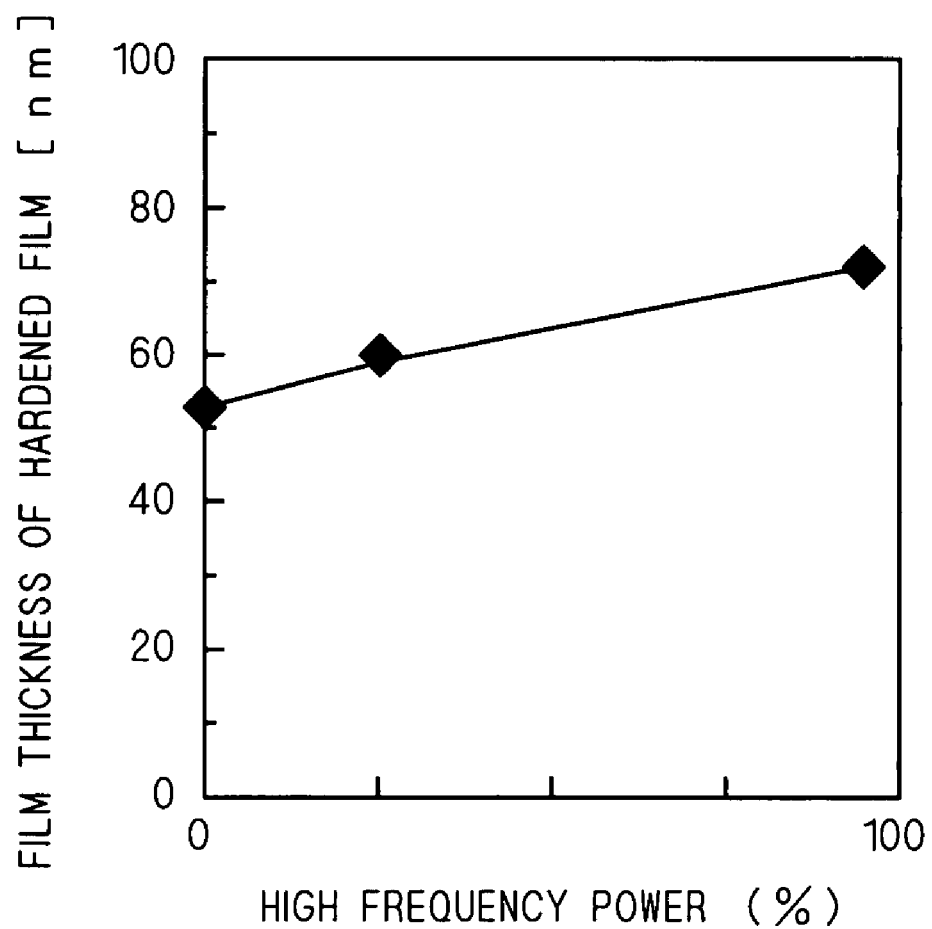

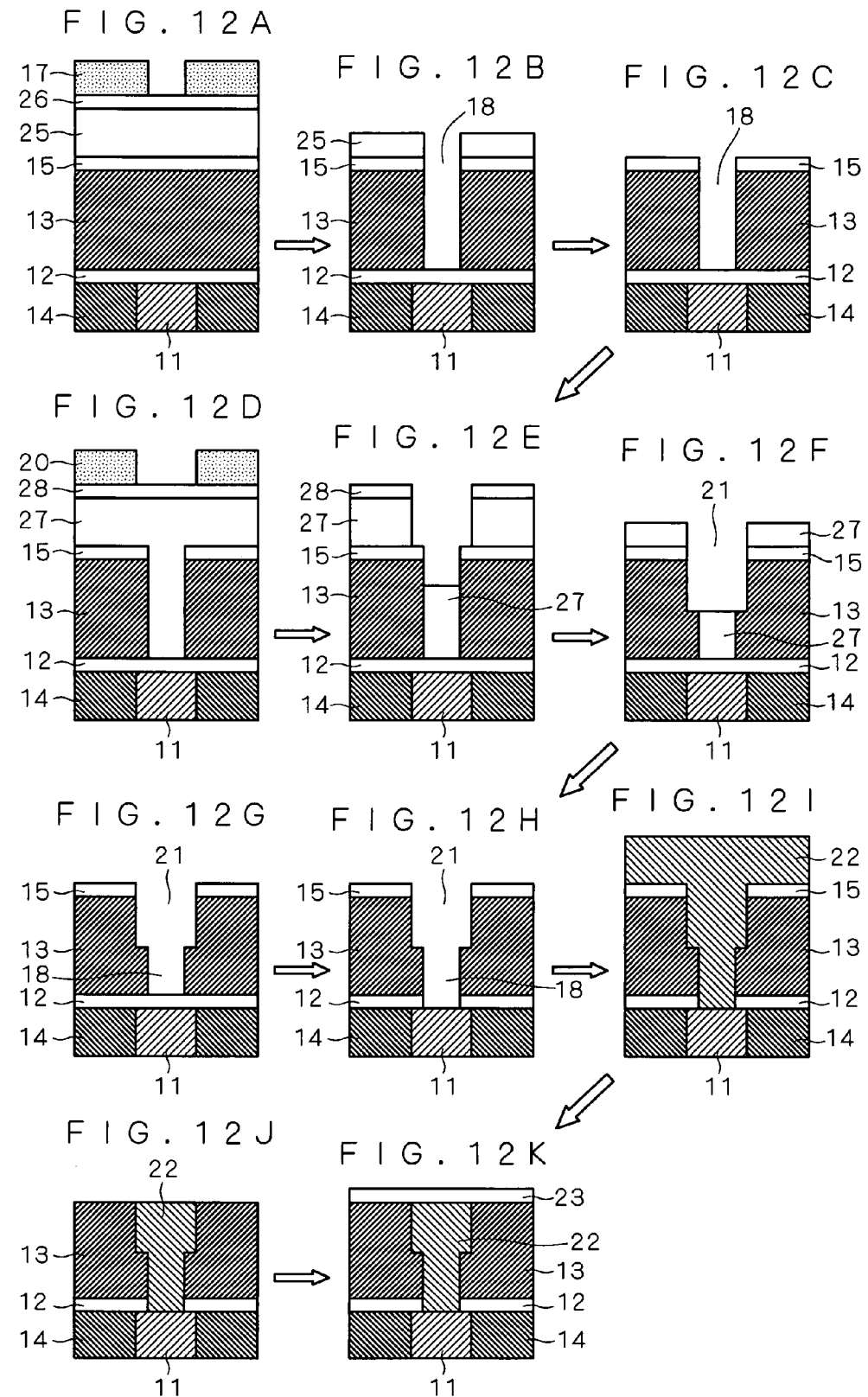

FIG. 16

| λ | 193nm |
|---|---|
| NA | Valiable |

| Layer | material | n | k | d |
|---|---|---|---|---|
| Top | RESIST | 1.72 | 0.02 | 150 |
| 3 | MIDDLE LAYER | 1.72 | 0.02 | Valiable |
| 2 | LOWER-LAYER ORGANIC FILM | 1.57~1.50 | 0.41~0.29 | 40 |
| 1 | SiO$_2$ | 1.563 | 0 | 200 |
| sub | SUBSTRATE | 0.883 | 2.778 | |

MANUFACTURING METHOD OF SEMICONDUCTOR DEVICE

BACKGROUND OF THE INVENTION

1. Field of the Invention

The present invention relates to a manufacturing method of a semiconductor device and more particularly, to a manufacturing method of a semiconductor device in which a predetermined pattern is formed in a film to be processed using a multilayer film.

2. Description of the Background Art

Recently, with the demands for miniaturization and high accuracy of a semiconductor device, it is a very important technical development issue to realize that a fine resist pattern is formed by lithography with high accuracy and a film to be processed is dry etched with high accuracy using the resist pattern as an etching mask at a fine processing step in its manufacturing process.

There are three restrictions mainly in forming the fine resist pattern by lithography as follows. Firstly, it is necessary to thin the resist as much as possible to improve resolution and prevent the pattern from being destroyed. Secondly, it is necessary to sacrifice plasma dry etching resistance in order to improve the resolution of a resist material. Thirdly, it is necessary to reduce a substrate reflection coefficient as much as possible in order to form the fine pattern with high accuracy.

Meanwhile, there are three restrictions mainly in dry etching the film to be processed using the resist pattern as the etching mask with high accuracy, as follows. Firstly, the etching mask has to have thickness to endure the dry etching for the film to be processed. Secondly, the etching mask has to have high selectivity for various kinds of film to be processed. Thirdly, the etching mask should not damage because of peeling after etching.

According to the conventional method using a monolayer resist on the film to be processed as the etching mask, it is hard to implement that the fine resist pattern is formed by lithography with high accuracy and the film to be processed is dry etched using the resist pattern as the etching mask with high accuracy. Thus, a process using a hard mask or a process using a multilayer resist has been developed for practical use.

Furthermore, a technique in which a photoresist is hardened by plasma containing bromide is disclosed in Japanese Patent Application Laid-open No. 2004-529231 or "Line edge roughness reduction by plasma curing photoresist.", Proc. SPIE Vol. 5753, (2005) pp. 380-389, and a technique in which the etching resistance of the resist mask is enhanced by implanting Ar ion to the resist mask in which a pattern is formed by lithography is disclosed in Japanese Patent Application Laid-open No. 2001-358061, Japanese Patent Application Laid-open No. 2002-329648, and "Ar Ion Implantation into Resist for Etching Resistance Improvement", Proc. SPIE Vol. 4345 (2001) pp. 655-664.

According to a general monolayer resist method, an organic or inorganic reflection preventing film to control reflection is formed on a film to be processed so as to have a film thickness of about 80 nm, and then a resist pattern having a film thickness of 250 nm to satisfy the dry etching resistance is formed thereon. When the pattern of 50 nm is formed, the aspect ratio=resist pattern thickness/resist pattern width is 5.0. In this case, since the aspect ratio of the resist pattern is too high, the pattern collapse is generated in the formed resist pattern.

When the film thickness of the resist is reduced to 120 nm to prevent the pattern collapse of the resist pattern, the resist cannot serve as the mask of the dry etching and the film to be processed after etching chips off. Thus, when the film thickness of the resist is reduced, the film to be processed chips off or its line edge is notched due to the resist deformation during the etching, so that the LER (Line Edge Roughness) of the film to be processed is increased.

When the film thickness of the resist is reduced to prevent the pattern collapse, and the hardening treatment to the resist is performed such that Ar, B, As, P, C, or H is implanted, reducing plasma such as $H_2$, HBr or $NH_3$ is used, DUV (Deep Ultraviolet) or VUV (Vacuum Ultraviolet) is light-irradiated, or EB (Electron Beam) is irradiated in order to enhance the dry etching resistance, the pattern deformation (e.g., leaning or excessively shrinkage in a large pattern) is generated depending on the layout of the resist pattern, so that the problem is that the pattern size is different from that originally designed. In the case where Ar, B, As, P, C or H is implanted into the resist, this pattern deformation is caused by the structure change in the resist film by a reducing effect generated by the implantation energy. In other hardening treatments, similar pattern deformation is generated although its degree is different, which is a big problem in manufacturing the device. That is, according to the above method, although the chipping off or LER of the film to be processed after etching can be improved, fidelity to the original design considerably deteriorates.

According to a multilayer resist method, a lower organic film is applied to a film to be processed as a lower-layer hard mask (HM), a SOG film (silsesquioxane film) having high etching selectivity is thinly applied to the lower organic film as a middle layer, and a conventional monolayer resist pattern is formed thereon. According to the multilayer resist method, the middle layer and the lower-layer HM are dry etched sequentially and finally the film to be processed is etched using the lower-layer HM pattern as an etching mask. In this multilayer resist method, when the selectivity between the lower organic film having high dry etch resistance and the middle layer used for etching it is ensured and the reflection coefficient can be controlled at the lithography step, the restrictions described in the background art can be all cleared. However, even in the multilayer resist method, although both lower layer and middle layer are required to be more rigid as the pattern becomes fine, sufficiently uniform rigidity is not always provided in the coating type film by the heat hardening treatment only and as a result, the LER deterioration is generated in the pattern after etching.

Furthermore, there is a multilayer hard mask (HM) method in which an amorphous carbon ($\alpha$-C) layer is formed on a film to be processed by CVD, a silicon nitride film or a silicon oxide film having high etching selectivity for the ($\alpha$-C) layer is formed by CVD as a middle layer and the conventional monolayer resist pattern is formed thinly thereon. According to this multilayer hard mask method, the middle layer and the ($\alpha$-C) layer are sequentially dry etched and finally the film to be processed is etched using the pattern of the ($\alpha$-C) layer as an etching mask. According to this multilayer hard mask method, since a uniform and rigid film can be formed as compared with the coating type multilayer resist method, it clears all the restrictions described in the background art. However, the problem in the multilayer hard mask method is that reflection coefficient control and chemical compatibility with the resist are bad.

In addition, when the multilayer hard mask method is applied to the via-first dual damascene step, although it is necessary to bury a lower-layer amorphous carbon ($\alpha$-C layer) into a via hole, there is a problem in filling characteristics of the amorphous carbon. In addition, although it is necessary to remove the buried amorphous silicon after the trench etching, since the amorphous carbon is rigid, it is difficult to remove it and as a result, the Low-k interlayer insulation film deteriorates (rise in k value).

SUMMARY OF THE INVENTION

It is an object of the present invention to provide a manufacturing method of a semiconductor device that reduces the deterioration in processed configuration and the pattern roughness of a film to be processed, sticks closely to its original design and can be applied to a dual damascene process and the like.

A manufacturing method of a semiconductor device according to the present invention comprises a processing mask layer forming step, a processing mask layer etching step, and a target layer etching step. The processing mask layer forming step forms a processing mask layer comprising at least one film and performs hardening treatment for at least one layer in the processing mask layer, by applying a film and heat hardening treatment. The processing mask layer etching step applies an exposing resist film to the processing mask and exposes and develops it to form a resist pattern, and etches the processing mask layer using the resist pattern as a mask. The film to be processed etching step etches the film to be processed using the pattern of the processing mask layer formed at the processing mask layer etching step as a mask.

According to the manufacturing method of the semiconductor device in the present invention, since the hardening treatment is performed for at least one processing mask layer, the deterioration in processed configuration and the pattern roughness of the film to be processed can be reduced and the pattern sticks closely to its original design.

Another manufacturing method of a semiconductor device of the present invention, which forming a dual damascene structure on a semiconductor substrate, comprises an opening step, a lower organic film forming step, a middle layer forming step, a middle layer etching step, a lower organic film etching step, a trench forming step, and a wiring layer forming step, wherein hardening treatment is performed for at least one of the lower organic film and the middle layer. The opening step opens a via hole in a low dielectric film formed on a lower wiring layer. The lower organic film forming step applies a lower organic film on the low dielectric film and buries the lower-layer organic film in the via hole. The middle layer forming step forms a middle layer containing silicon oxide on the lower organic film. The middle layer etching step forms a resist pattern of trench on the middle layer and etches the middle layer using the resist pattern as a mask. The lower organic film etching step etches the lower organic film using a pattern of the middle layer formed at the middle layer etching step as a mask. The trench forming step etches the low dielectric film using a pattern of the lower organic film formed at the lower organic film etching step as a mask and forms the trench having a depth not reaching a bottom of the via hole. The wiring layer forming step removes a layer existing in the via hole on the lower wiring layer and buries a wiring layer material in the via hole and the trench.

According to another manufacturing method of the semiconductor device in the present invention, when the dual damascene structure is formed, the etching resistance can be raised only at the part from the surface to the necessary depth point, and the part buried in the via hole is made not to be affected by the hardening treatment.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6, 7A, 7B and 8 are views to explain a plasma treatment performed in the manufacturing method of the semiconductor device according to the embodiment 4 of the present invention;

FIGS. 11A to 11K and 12A to 12K are flowcharts as a premise of a manufacturing method of a semiconductor device according to an embodiment 5 of the present invention;

FIG. 16 is a view to explain a film constitution of a semiconductor device according to an embodiment 6 of the present invention;

DESCRIPTION OF THE PREFERRED EMBODIMENTS

First Embodiment

Figure 1:
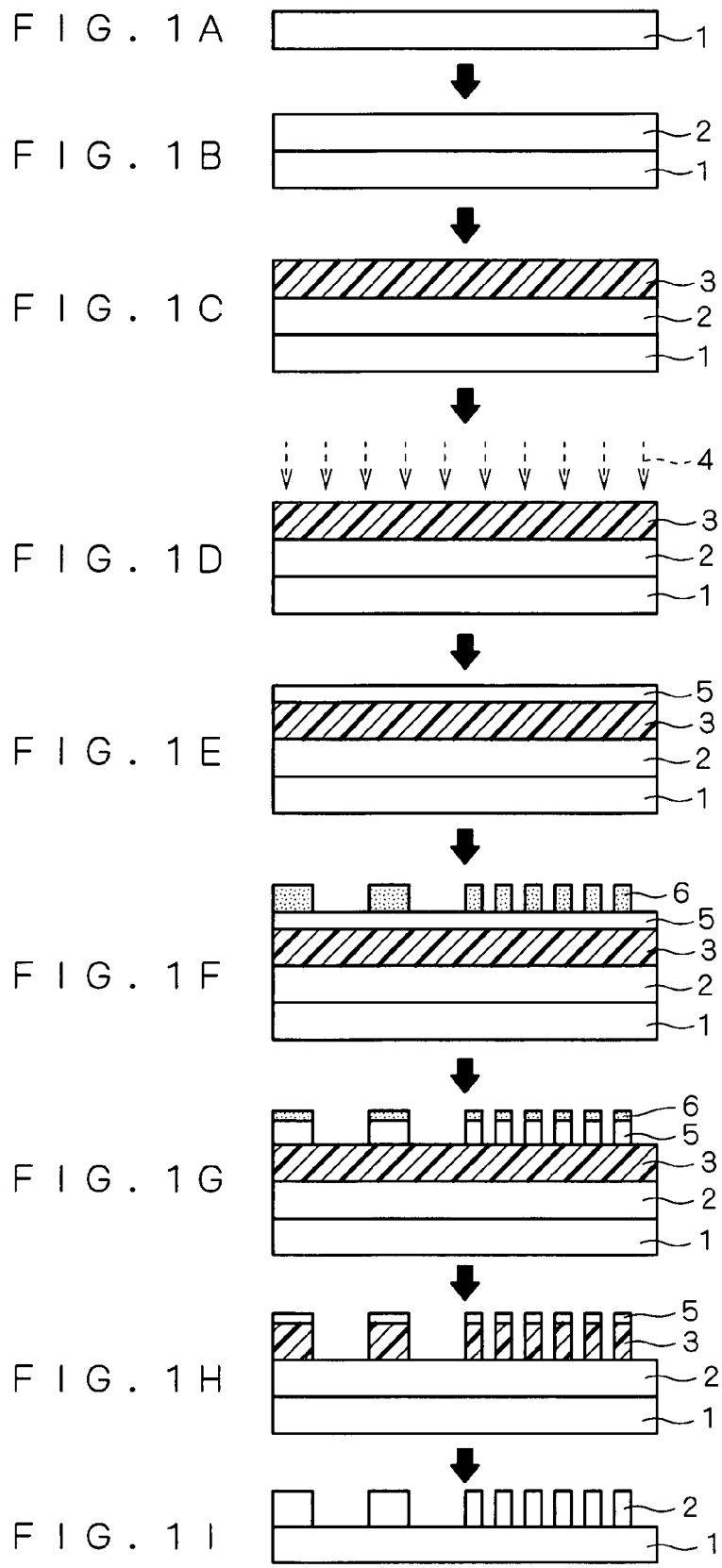
FIGS. 1A to 1I are flowcharts showing a manufacturing method of a semiconductor device according to an embodiment 1 of the present invention.

FIGS. 1A to 1I are flowcharts to explain a manufacturing method of a semiconductor device according to this embodiment. First, a film to be processed 2 is formed on a substrate 1 (Si substrate and the like) shown in FIG. 1A by sputtering, CVD (Chemical Vapor Deposition) and the like (FIG. 1B). In FIG. 1C, a coating type of lower organic film 3 having a film thickness of about 150 to 300 nm is applied to the film to be processed 2 and then a heat treatment is performed at 200 to 250° C. for about 1 to 1.5 minutes. By performing the heat treatment for the low organic film 3, a solvent can be sufficiently volatilized through a heat hardening process by a thermochemical reaction and a crosslink can be formed in a polymer by the reaction at a heat reaction active site.

In FIG. 1D, hardening treatment 4 is performed such that any one of Ar, B, As, P, C and H is implanted to the lower organic film 3 after the heat treatment and the lower organic film 3 is carbonized (graphitized). In addition, instead of the above hardening treatment 4, a hardening treatment 4 in which oxygen that deteriorates etching resistance is reduced to be carbon hydride by reducing plasma such as $H_2$, HBr, and $NH_3$, or a hardening treatment 4 in which a crosslink structure is further densified by light irradiation of DUV or VUV, or EB irradiation may be performed.

In addition, it is necessary to consider that the structure of the lower organic film 3 varies during the hardening treatment 4 and accordingly optical constant varies, and the film thickness of the lower organic film 3 shrinks to 70 to 80% of that just after applying and the heat hardening treatment. Thus, in FIG. 1C, when the lower organic film 3 is applied, it is necessary to set a film thickness and control a reflection coefficient in view of the fact that the film thickness is reduced. Among the above hardening treatments 4, the implantation process in which an atomic composition ratio itself varies and the plasma reducing treatment are especially effective.

Then, in FIG. 1E, a middle layer 5 is formed on the lower organic film 3 after the hardening treatment 4. In a case the lower organic film 3 has been completely graphitized and become an inorganic film by the hardening treatment 4, an oxide film formed by CVD and the like may be the middle layer 5. However, in the hardening treatment 4, implantation energy or high-frequency power of the plasma is controlled so that the lower organic film 3 can be graphitized from the surface to a predetermined depth in general. Therefore, since the lower organic film 3 is not graphitized completely and does not become the inorganic film completely, it is difficult to form the middle layer 5 with the oxide film formed by CVD.

Thus, the middle layer 5 is formed such that a resin having a functional group containing an aromatic ring and the like absorbing an exposure wavelength and a functional group having a thermal reactive siloxane residue or a cross-linking active group in a silsesquioxane-type polymer such as inorganic SOG (spin-on glass) or organic SOG is used and applied so as to have a thickness of about 80 nm by a coating and developing apparatus. The applied middle layer 5 needs to be crosslinked by a dehydrating and condensing reaction with a heat treatment at 200 to 250° C. for about 1 to 1.5 minutes or by a reaction of a reaction active site such as epoxy functional group. According to this embodiment, a process flow that is simple, inexpensive and highly productive can be provided by forming all of the multilayer film by the coating apparatus as described above. In addition, according to this embodiment, the lower organic film 3 and the middle layer 5 are processing mask layers used for processing the film to be processed 2.

Then, in FIG. 1F, a resist film for exposure is applied to the middle layer 5 and a resist pattern 6 having a desired pattern is formed using lithography. In FIG. 1G, the middle layer 5 is dry etched using the resist pattern 6 as a mask. Then, in FIG. 1H, the lower organic film 3 is dry etched using the pattern of the middle layer 5 formed in FIG. 1G as a mask. Then, in FIG. 1I, the processing film 2 is dry etched using the pattern of the lower organic film 3 formed in FIG. 1H as a mask and the pattern of the remaining lower organic film 3 is removed by ashing and the like. Thus, a desired pattern as shown in FIG. 1I is formed on the film to be processed 2.

In addition, it is desired that an organic polymer that can provide a carbon-rich rigid film through the hardening treatment 4 is used for the lower organic film 3. A polymer that satisfies an optical constant, dry etching resistance, coating characteristics (filling characteristics) and the like is selected for the lower organic film 3 by copolymerizing or mixing polymers having different optical characteristics such as a polymer containing polycyclic aromatic compound (polymer containing naphthalene or anthracene), a phenol polymer containing benzene rich aromatic ring, and a polymer containing saturated aliphatic cyclic compound.

In addition, as for the process in which Ar, B, As, P, C or H is implanted for carbonization (graphitization) in the hardening treatment 4, the relationship between implantation energy and implantation depth can be found by a document (for example, "Projected Range Statistics $2^{nd}$ Edition", James F. Gibbons, William S. Johnson, Steven W. Mylroie) or an experimental result. The hardening treatment 4 is performed by controlling the implantation energy in consideration of the above relationship, and thereby the thickness of the layer to be graphitized can be adjusted. That is, the hardening treatment 4 can adjust the thickness of the hardened layer by varying a process condition (implantation energy).

For example, when B is implanted, the lower organic film 3 having a thickness of 108 nm and a thickness of 226 nm is graphitized by the implantation energy of 10 KeV and 20 KeV, respectively. In addition, when Ar is implanted, the lower organic film 3 having a thickness of 45 nm, a thickness of 112 nm, and a thickness of 180 nm is graphitized by the implantation energy of 10 KeV, 30 KeV and 50 KeV, respectively. In addition, when C is implanted, the lower organic film 3 having a thickness of 91 nm, a thickness of 189 nm, and a thickness of 290 nm is graphitized by the implantation energy of 10 KeV, 20 KeV and 30 KeV, respectively. In any case, the implantation amount is not less than $5 \times 10^{13}/cm^2$.

Similarly, in the case of the hardening treatment 4 by the EB irradiation, the thickness of the hardened layer can be adjusted by varying the irradiation accelerating voltage (100 to 300 KV) and the irradiation amount (0.2 to 1.2 $mC/cm^2$) of the electron. Similarly, in the case of the hardening treatment 4 by the DUV·VUV irradiation, since the depth to which the light can reach is determined from the wavelength of the selected irradiation light and the absorption coefficient of the irradiation light for the lower organic film 3, the thickness of the hardened layer can be adjusted. In addition, in the case of the hardening treatment 4 by the DUV·VUV irradiation, the hardened degree of the lower organic film 3 can be also adjusted by controlling a light irradiation time and a stage temperature at the time of the irradiation.

As described above, according to the manufacturing method of the semiconductor device according to this embodiment, the method comprises forming the multilayer film by applying the plurality of organic films on the film to be processed and forming a fine pattern on the film to be processed using the multilayer film, wherein since the hardening treatment is performed for the lower organic film after the lower organic film has been formed, there can be provided an effect that the deterioration in configuration and the pattern roughness of the film to be processed are reduced, so that fine processing close to the original design can be implemented.

In addition, in this embodiment, although the multilayer film provided under the resist layer for exposure comprises two layers comprising the middle layer 5 and the lower organic film 3, the present invention is not limited to this. For example, the multilayer may comprise only the lower organic film 3 or three or more layers comprising the middle layer 5 and the lower organic film 3. Furthermore, although the film to be processed 2 is patterned in this embodiment, the substrate 1 may be patterned by a processing mask layer has been formed on the substrate 1.

Second Embodiment

Figure 2:
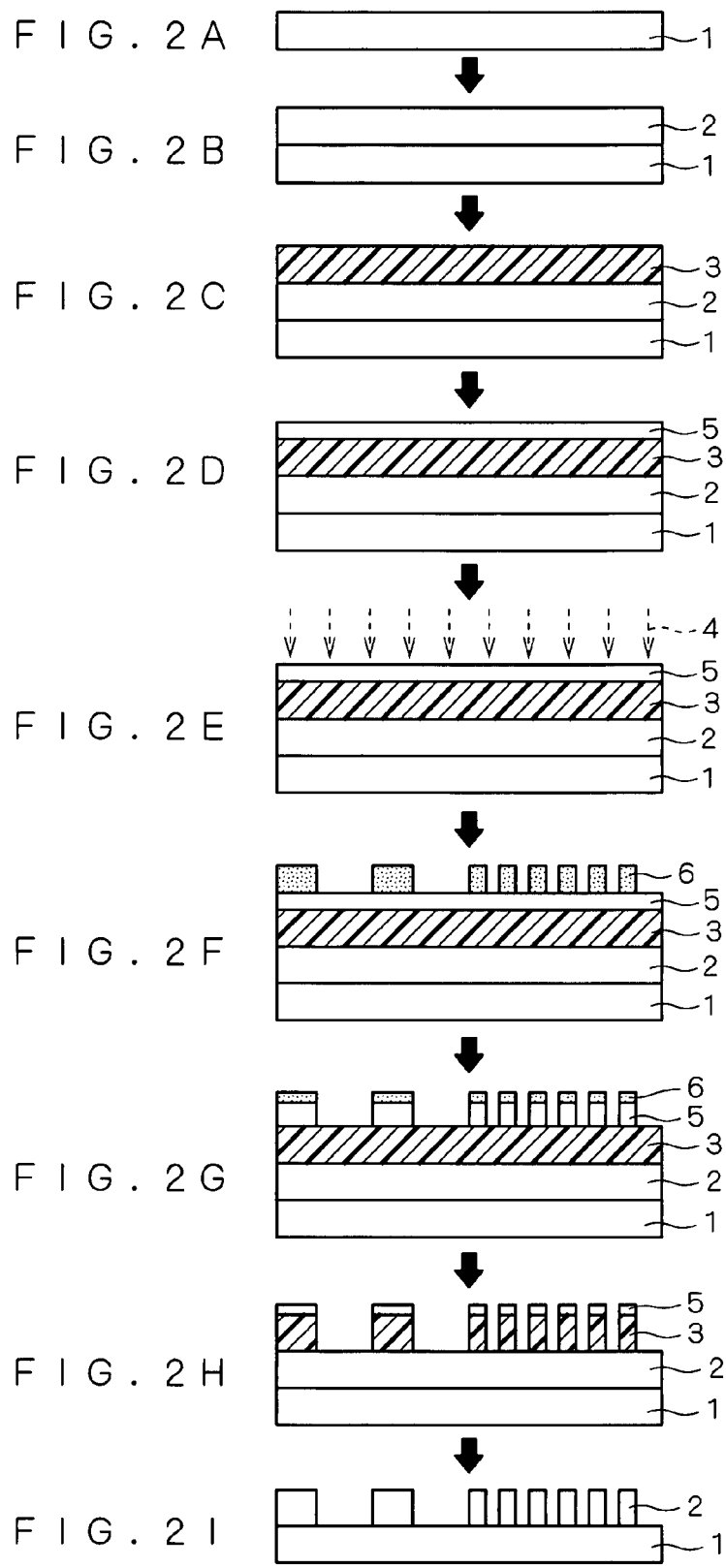
FIG. 2A to 2I are flowcharts showing a manufacturing method of a semiconductor device according to an embodiment 2 of the present invention.

FIGS. 2A to 2I are flowcharts to explain a manufacturing method of a semiconductor device according to this embodiment. First, a film to be processed 2 is formed on a substrate 1 (Si substrate and the like) shown in FIG. 2A by sputtering, CVD and the like (FIG. 2B). In FIG. 2C, a coating type of lower organic film 3 having a film thickness of about 150 to 300 nm is applied to the film to be processed 2 and then a heat treatment is performed at 200 to 250° C. for about 1 to 1.5 minutes. By performing the heat treatment for the low organic film 3, a solvent can be sufficiently volatilized through a heat hardening process by a thermochemical reaction and a crosslink can be formed in a polymer by the reaction at a thermal reaction active site.

In FIG. 2D, a middle layer 5 is formed on the lower organic film 3 after the heat treatment. A silsesquioxane-type polymer such as inorganic SOG or organic SOG is used for the middle layer 5 and applied so as to have a thickness of about 80 nm by a coating and developing apparatus. The applied middle layer 5 needs to be crosslinked by a dehydrating and condensing reaction with a heat treatment at 200 to 250° C. for about 1 to 1.5 minutes or by the reaction of a thermal reaction active site such as epoxy functional group.

Then, in FIG. 2E, a hardening treatment 4 is performed such that any one of Ar, B, As, P, C and H is implanted to the lower organic film 3 and the lower organic film 3 is carbonized (graphitized). In addition, instead of the above hardening treatment 4, a hardening treatment 4 in which oxygen that deteriorates etching resistance is reduced to be carbon hydride by reducing plasma such as $H_2$, HBr, and $NH_3$, or a hardening treatment 4 in which a crosslink structure is further densified by light irradiation of DUV or VUV, or EB irradiation may be performed.

In addition, the hardening treatment 4 is performed such that the structure of the part other than a Si oxide film structure in the middle layer 5 is reformed so as to have pure $SiO_2$ or improve silicon ratio by implanting any one of Ar, B, As, P, C, H and Si to the middle layer 5. In addition, instead of the above hardening treatment 4, a hardening treatment 4 may be performed such that the structure other than the Si oxide film structure in the middle layer 5 is reformed so as to have pure $SiO_2$ or improve the silicon ratio by reducing plasma $H_2$, HBr, $NH_3$ or the like. In addition, the implantation is preferably performed in the hardening treatment 4 for the middle layer.

Then, in FIG. 2F, a resist film for exposure is applied to the middle layer 5 and a resist pattern 6 having a desired pattern is formed using lithography. In FIG. 2G, the middle layer 5 is dry etched using the resist pattern 6 as a mask. Then, in FIG. 2H, the lower organic film 3 is dry etched using the pattern of the middle layer 5 formed in the FIG. 2G as a mask. Then, in FIG. 2I, the processing film 2 is dry etched using the pattern of the lower organic film 3 formed in FIG. 2H as a mask and the pattern of the remaining lower organic film 3 is removed by ashing and the like. Thus, a desired pattern as shown in FIG. 2I is formed in the film to be processed 2.

According to this embodiment, since the hardening treatment 4 is performed for the lower organic film 3 and the middle layer 5, multistage hardening treatment can be sequentially performed by varying, for example, an implantation seed or implantation energy for each film.

It is desired that an organic polymer that can provide a carbon-rich rigid film through the hardening treatment 4 is used for the lower organic film 3. A polymer that satisfies an optical constant, dry etching resistance, coating characteristics (filling characteristics) and the like is selected for the lower organic film 3 by copolymerizing or mixing polymers having different optical characteristics such as a polymer containing polycyclic aromatic compound (polymer containing naphthalene or anthracene), a phenol polymer containing benzene rich aromatic ring, a polymer containing saturated aliphatic cyclic compound.

Meanwhile, a resin having a functional group containing an aromatic ring absorbing an exposure wavelength and a functional group having a thermal reactive siloxane residue or a cross-linking active group in a silsesquioxane-type polymer such as inorganic SOG or organic SOG is used for the middle layer 5.

In addition, in the hardening treatments 4, as for the process in which Ar, B, As, P, C or H is implanted for carbonizing (graphitizing) the lower organic film 3 or the process in which Ar, B, As, P, C, H and Si is implanted for improving the Si content in the middle layer 5, the relationship between implantation energy and implantation depth can be found by a document (for example, "Projected Range Statistics 2nd Edition", James F. Gibbons, William S. Johnson, Steven W. Mylroie) or an experimental result. The hardening treatment 4 is performed by controlling the implantation energy in consideration of the above relationship, and thereby the thickness of the layer to be graphitized or the thickness having a high Si content can be adjusted. That is, the hardening treatment 4 can adjust the thickness of the hardened layer by varying a process condition (implantation energy).

For example, when B is implanted, layers having a thickness of 108 nm and a thickness of 226 nm can be hardened by the hardening treatment 4 at implantation energies of 10 KeV and 20 KeV, respectively. In addition, when Ar is implanted, layers having a thickness of 45 nm, a thickness of 112 nm, and a thickness of 180 nm can be hardened by the hardening treatment 4 at implantation energies of 10 KeV, 30 KeV and 50 KeV, respectively. In addition, when C is implanted, layers having a thickness of 91 nm, a thickness of 189 nm, and a thickness of 290 nm can be hardened by the hardening treatment 4 at implantation energies of 10 KeV, 20 KeV and 30 KeV, respectively. In any case, the implantation amount is not less than $5 \times 10^{13}/cm^2$.

Similarly, in the case of the hardening treatment 4 by the EB irradiation, the thickness of the hardened layer can be adjusted by varying the irradiation accelerating voltage (100 to 300 KV) and the irradiation amount (0.2 to 1.2 $mC/cm^2$) of the electron. Similarly, in the case of the hardening treatment 4 by the DUV·VUV irradiation, since the depth to which the light can reach is found from the wavelength of the selected irradiation light and the absorption coefficient of the irradiation light of the lower organic film 3 and the middle layer 5, the thickness of the hardened layer can be adjusted. In addition, in the case of the hardening treatment 4 by the DUV·VUV irradiation, the hardened degrees of the lower organic film 3 and the middle layer 5 can be also adjusted by controlling a light irradiation time and a stage temperature at the time of the irradiation.

As described above, according to the manufacturing method of the semiconductor device according to this embodiment, the method comprises forming the multilayer film by applying the plurality of organic films on the film to be processed and forming a fine pattern on the film to be processed using the multilayer film, wherein since the hardening treatment 4 is performed for at least one film of the lower organic film 3 and the middle layer 5 after the middle layer has been formed, there can be provided an effect that the deterioration in configuration and the pattern roughness of the film to be processed are reduced, so that fine processing close to the original design can be implemented.

In addition, in this embodiment, although the multilayer film provided under the resist film for exposure comprises two layers comprising the middle layer 5 and the lower organic film 3, the present invention is not limited to this. For example, the multilayer film may comprise three or more layers comprising the middle layer 5 and the lower organic film 3.

Third Embodiment

Figure 3:
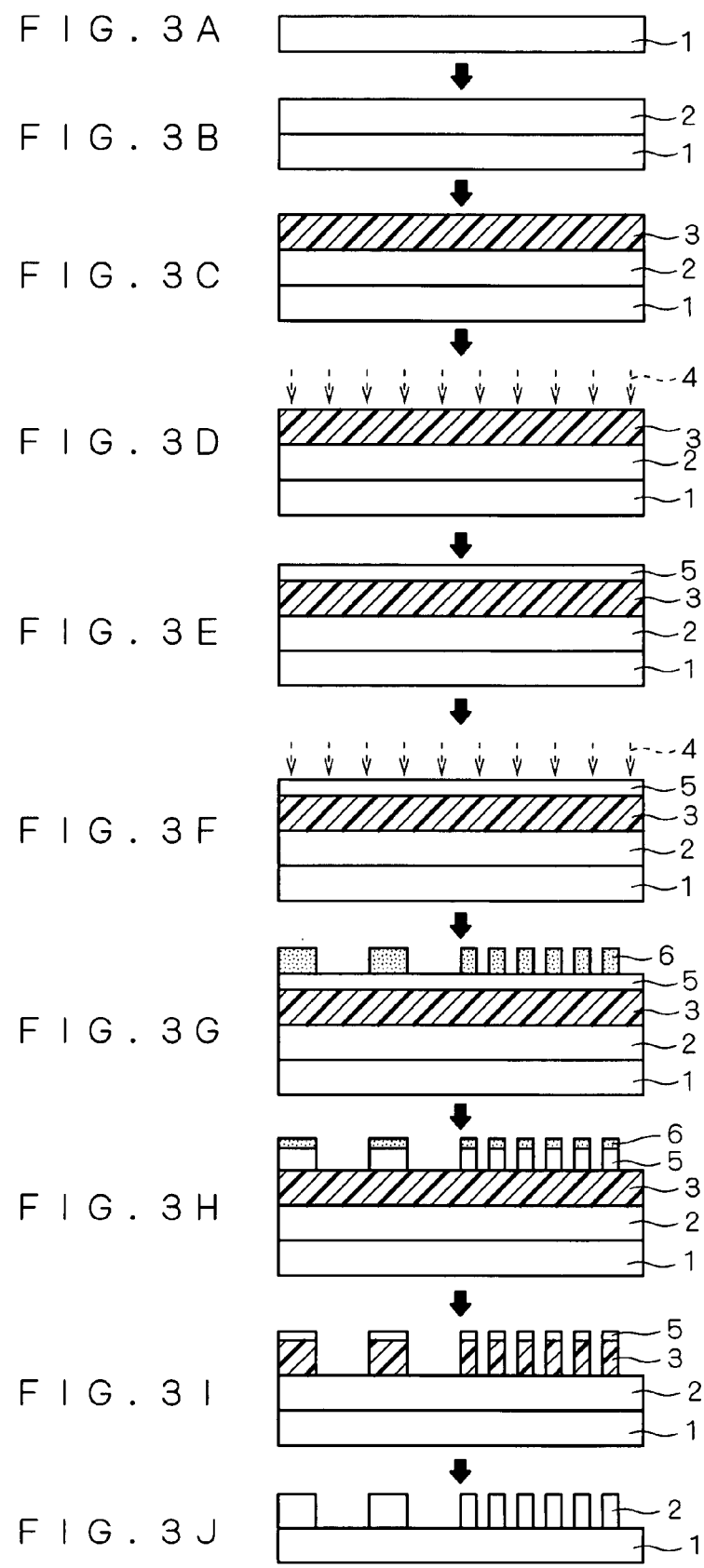
FIG. 3A to 3J are flowcharts showing a manufacturing method of a semiconductor device according to an embodiment 3 of the present invention.

FIGS. 3A to 3I are flowcharts to explain a manufacturing method of a semiconductor device according to this embodiment. First, a film to be processed 2 is formed on a substrate 1 (Si substrate and the like) shown in FIG. 3A by sputtering, CVD and the like (FIG. 3B). In FIG. 3C, a coating type of lower organic film 3 having a film thickness of about 150 to 300 nm is applied to the film to be processed 2 and then a heat treatment is performed at 200 to 250° C. for about 1 to 1.5 minutes. By performing the heat treatment for the low organic film 3, a solvent can be sufficiently volatilized through a heat hardening process by a thermochemical reaction and a crosslink can be formed in a polymer by the reaction at a thermal reaction active site.

In FIG. 3D, a hardening treatment is performed such that any one of Ar, B, As, P, C and H is implanted to the lower organic film 3 after the heat treatment and the lower organic film 3 is carbonized (graphitized). In addition, instead of the above hardening treatment 4, a hardening treatment 4 in which oxygen that deteriorates etching resistance is reduced to be carbon hydride by reducing plasma $H_2$, HBr, $NH_3$ or the like, or a hardening treatment 4 in which a crosslink structure is further densified by light irradiation of DUV or VUV, or EB irradiation may be performed.

Then, in FIG. 3E, a middle layer 5 is formed on the lower organic film 3 after the hardening treatment 4. A silsesquioxane-type polymer such as inorganic SOG or organic SOG is used for the middle layer 5 and applied so as to have a thickness of about 80 nm by a coating and developing apparatus. The applied middle layer 5 needs to be crosslinked by a dehydrating and condensing reaction with a heat treatment at 200 to 250° C. for about 1 to 1.5 minutes or by a reaction of thermal reaction active site such as epoxy functional group.

Then, in FIG. 3F, a hardening treatment 4 is performed such that any one of Ar, B, As, P, C, H and Si is implanted to the middle layer 5 and the structure of the part other than the Si oxide film structure of the middle layer 5 is reformed so as to have pure Si or improve the silicon ratio. In addition, instead of the hardening treatment 4, a hardening treatment 4 in which the structure of the part other than the Si oxide film structure of the middle layer 5 is reformed so as to have pure Si or improve the silicon ratio by reducing plasma $H_2$, HBr, $NH_3$ or the like may be performed. In addition, the implantation is preferably performed in the hardening treatment 4 for the middle layer 5.

Then, in FIG. 3G, a resist film for exposure is applied to the middle layer 5 and a resist pattern 6 having a desired pattern is formed using lithography. In FIG. 3H, the middle layer 5 is dry etched using the resist pattern 6 as a mask. Then, in FIG. 3I, the lower organic film 3 is dry etched using the pattern of the middle layer 5 formed in the FIG. 3H as a mask. Then, in FIG. 3J, the film to be processed 2 is dry etched using the pattern of the lower organic film 3 formed in FIG. 3I as a mask and the pattern of the remaining lower organic film 3 is removed by ashing and the like. Thus, a desired pattern as shown in FIG. 3J is formed on the film to be processed 2.

According to this embodiment, since the hardening treatment 4 is performed for the lower organic film 3 and the middle layer 5, multistage hardening treatment can be sequentially performed by varying, for example, an implantation seed or implantation energy for each film.

It is desired that an organic polymer that can provide a carbon-rich rigid film through the hardening treatment 4 is used for the lower organic film 3. A polymer that satisfies an optical constant, dry etching resistance, coating characteristics (filling characteristics) and the like is selected for the lower organic film 3 by copolymerizing or mixing polymers having difference optical characteristics such as a polymer containing polycyclic aromatic compound (polymer containing naphthalene or anthracene), a phenol polymer containing benzene rich aromatic ring, a polymer containing saturated aliphatic cyclic compound and the like.

Meanwhile, a resin having a functional group containing an aromatic ring absorbing an exposure wavelength and a functional group having a thermal reactive siloxane residue or a cross-linking active group in silsesquioxane-type polymer such as inorganic SOG or organic SOG is used for the middle layer 5.

In addition, in the hardening treatment 4, as for the process in which Ar, B, As, P, C or H is implanted for carbonizing (graphitizing) the lower organic film 3 or the process in which Ar, B, As, P, C, H and Si is implanted for improving the Si content in the middle layer 5, the relationship between implantation energy and implantation depth can be found by a document (for example, "Projected Range Statistics 2nd Edition", James F. Gibbons, William S. Johnson, Steven W. Mylroie) or an experimental result. The hardening treatment 4 is performed by controlling the implantation energy in consideration of the above relation, and thereby the thickness of the layer to be graphitized or the thickness having a high Si content can be adjusted. That is, the hardening treatment 4 can adjust the thickness of the hardened layer by varying a process condition (implantation energy).

For example, when B is implanted, layers having a thickness of 108 nm and a thickness of 226 nm can be hardened by the hardening treatment 4 at implantation energies of 10 KeV and 20 KeV, respectively. In addition, when Ar is implanted, layers having a thickness of 45 nm, a thickness of 112 nm, and a thickness of 180 nm can be hardened by the hardening treatment 4 at implantation energies of 10 KeV, 30 KeV and 50 KeV, respectively. In addition, when C is implanted, layers having a thickness of 91 nm, a thickness of 189 nm, and a thickness of 290 nm can be hardened by the hardening treatment 4 at implantation energies of 10 KeV, 20 KeV and 30 KeV, respectively. In any case, the implantation amount is not less than $5 \times 10^{13}/cm^2$.

Similarly, in the case of the hardening treatment 4 by the EB irradiation, the thickness of the hardened layer can be adjusted by varying the irradiation accelerating voltage (100 to 300 KV) and the irradiation amount (0.2 to 1.2 $mC/cm^2$) of the electron. Similarly, in the case of the hardening treatment 4 by the DUV·VUV irradiation, since the depth to which the light can reach is found from the wavelength of the selected irradiation light and the absorption coefficient of the irradiation light of the lower organic film 3 and the middle layer 5, the thickness of the hardened layer can be adjusted. In addition, in the case of the hardening treatment 4 by the DUV·VUV irradiation, the hardened degrees of the lower organic film 3 and the middle layer 5 can be also adjusted by controlling a light irradiation time and a stage temperature at the time of the irradiation.

As described above, according to the manufacturing method of the semiconductor device according to this embodiment, the method comprises forming the multilayer film by applying the plurality of organic films on the film to be processed and forming a fine pattern on the film to be processed using the multilayer film, wherein since the hardening treatment 4 is performed for the lower organic film 3 after the lower organic film 3 forming step and the hardening treatment 4 is performed for the middle layer 5 after the middle layer 5 forming step, there can be provided an effect that the deterioration in configuration and the pattern roughness of the film to be processed are reduced, so that fine processing close to the original design can be implemented.

In addition, in this embodiment, although the multilayer film provided under the resist film for exposure comprises two layers comprising the middle layer 5 and the lower organic film 3, the present invention is not limited to this. For example, the multilayer film may comprise three or more layers comprising the middle layer 5 and the lower organic film 3.

Fourth Embodiment

In this embodiment, the reducing plasma treatment among the hardening treatments described in the embodiments 1 to 3 will be described in detail.

Figure 4:
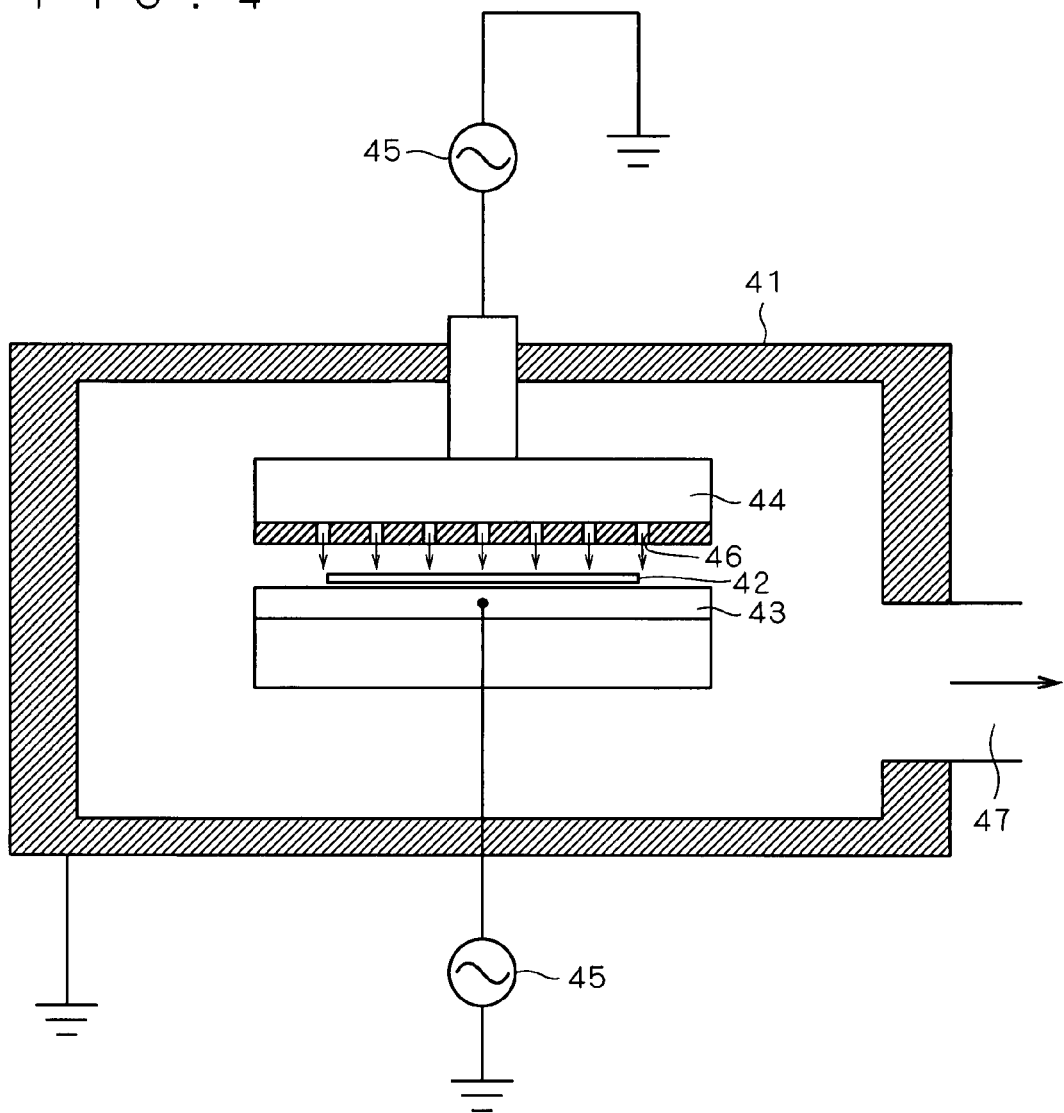
FIG. 4 is a schematic view showing a plasma processing equipment used in a manufacturing method of a semiconductor device according to an embodiment 4 of the present invention.

First, FIG. 4 shows a plasma processing equipment used in the plasma treatment in this embodiment. The plasma processing equipment shown in FIG. 4 is a 2-cycle excitation parallel plate type RIE (Reactive Ion Etching) equipment. The 2-cycle excitation parallel plate type RIE (hereinafter referred to as "the plasma processing equipment" simply) shown in FIG. 4 comprises a stage (a lower electrode 43) provided at the lower part of a reaction chamber 41, on which a Si substrate 42 is set, and an upper electrode 44 provided at the upper part of the reaction chamber 41 so as to be opposed and parallel to the lower electrode 43. A high frequency voltage is applied to each of the upper electrode 44 and the lower electrode 43 from a separate high frequency power supply 45. In addition, the upper electrode 44 is provided with gas inlets 46 from which gas is supplied into the reaction chamber 41. The reaction chamber 41 is exhausted through an outlet 47.

Figure 5:
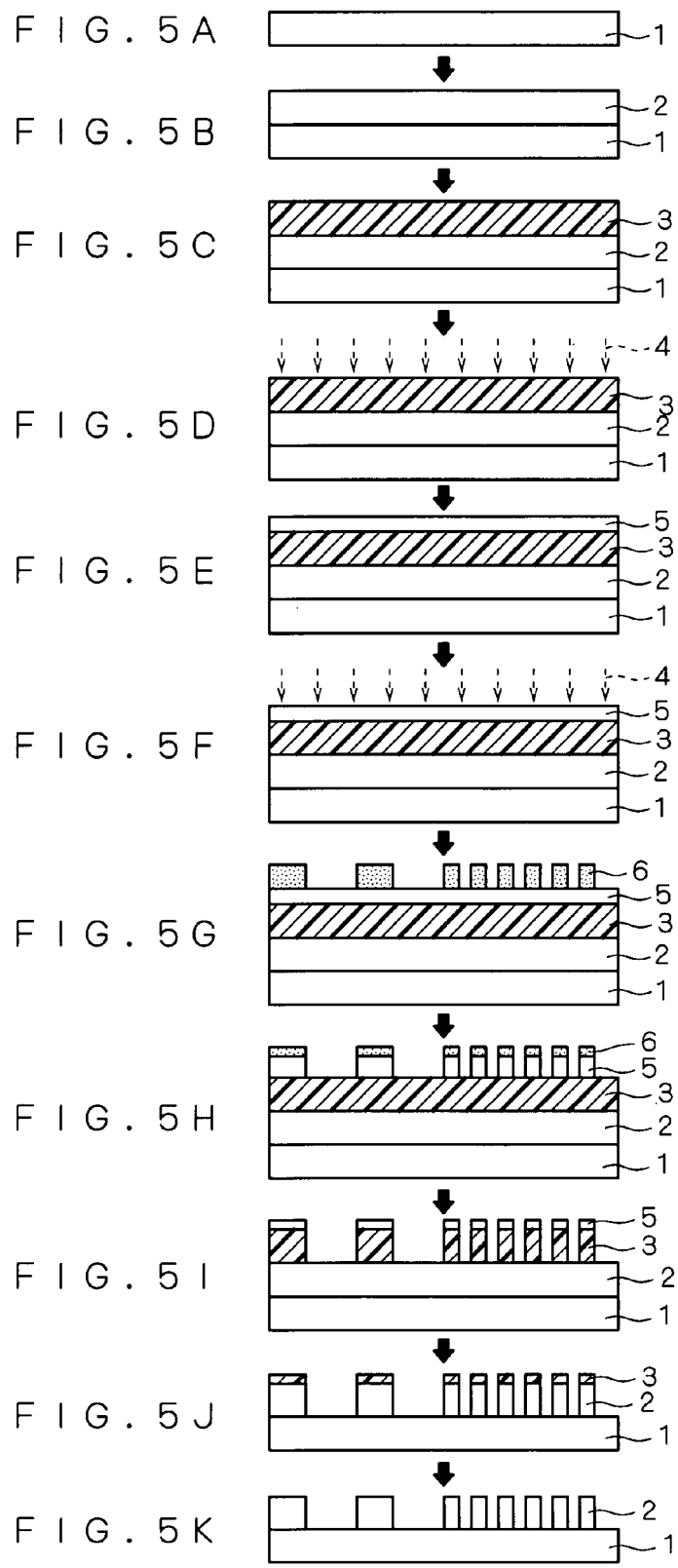
FIGS. 5A to 5K are flowcharts showing the manufacturing method of the semiconductor device according to the embodiment 4 of the present invention.

FIGS. 5A to 5K are flowcharts of a manufacturing method of a semiconductor device in which the hardening treatment is performed by the plasma treatment. First, a processing film 2 is formed on a substrate 1 (Si substrate and the like) shown in FIG. 5A by sputtering, CVD and the like (FIG. 5B). In FIG. 5C, a coating type of lower organic film 3 having a thickness of about 150 to 300 nm is formed on the film to be processed 2 and then heat treatment is performed at 200 to 250° C. for about 1 to 1.5 minutes.

Then, in FIG. 5D, the substrate 1 on which the lower organic film 3 is applied and hardened by the heat treatment is transferred into the reaction chamber 41 in the 2-cycle excitation parallel plate type RIE equipment shown in FIG. 4 and then the plasma treatment (hardening treatment 4) is performed. According to the plasma treatment in this embodiment, reducing gas such as hydrogen, hydrogen bromide, or ammonia is supplied from the gas inlets 46 into the reaction chamber 41 shown in FIG. 4 while a pressure is kept constant and a high frequency power is applied to the upper electrode 44 and the lower electrode 43 to generate plasma and the lower organic film 3 is exposed to the plasma for a certain period of time. Thus, hydrogen ion generated in the plasma is implanted into the lower organic film 3 and a rigid film that is hydrocarbonated or carbonated is formed in the lower organic film 3.

Especially, in the hydrogen plasma treatment using hydrogen gas, it is preferable that the treatment is performed such that a high frequency power is applied to the upper electrode 44 and the lower electrode 43 to generate plasma for 10 to 30 seconds with hydrogen 100 to 500 sccm at pressure 2.0 to 10.0 Pa. In addition, since bromide is not contained in the hydrogen plasma treatment, the bromide does not affect the film to be treated.

Figure 6:
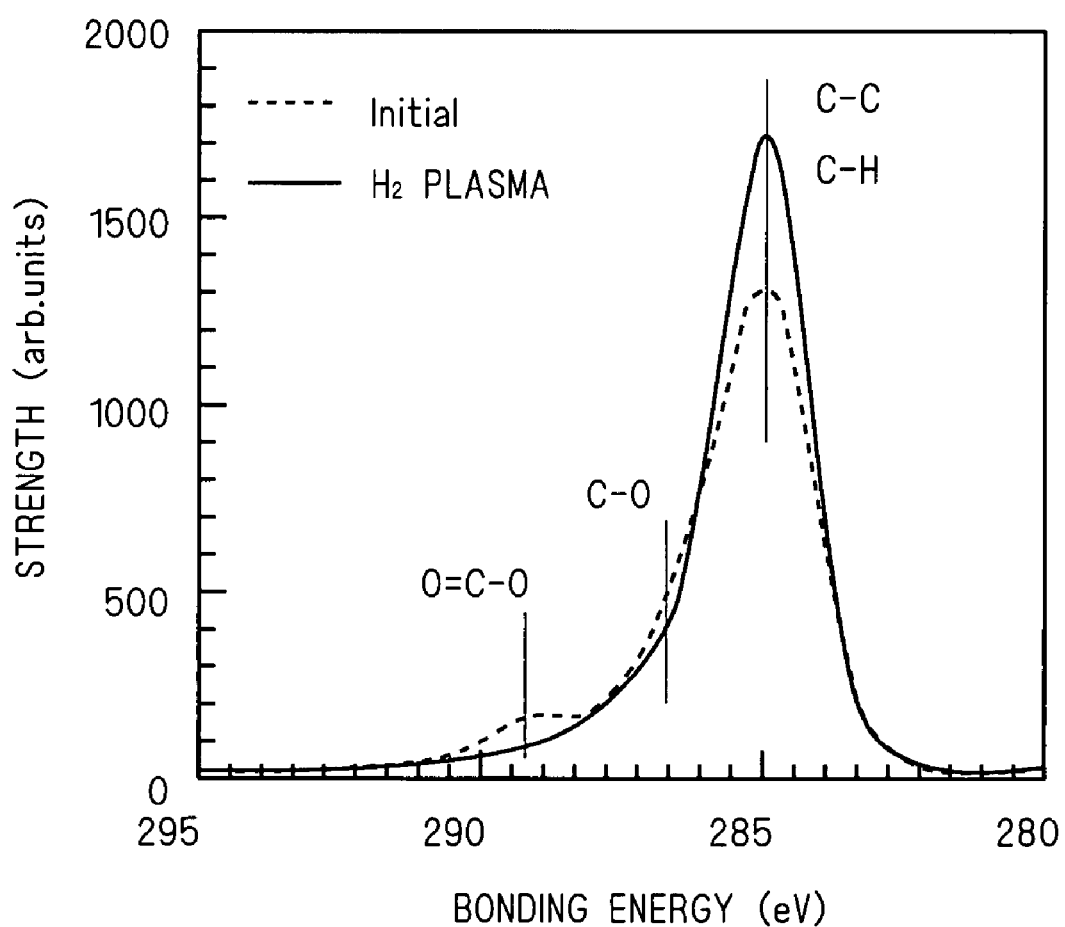

A description will be made of the result that is analyzed using a XPS (X-ray Photoelectron Spectrometry) method and FT-IR (Fourier Transform Infrared Spectroscopy) method after the hydrogen plasma treatment is performed to the resist under the above condition. It can be seen from the analyzed result by the XPS method shown in FIG. 6 that peak values of O=C—O bond and C—O bond in the resist are reduced by the hydrogen plasma treatment and the peak value of C—H bond or C—C bond is increased by the hydrogen plasma treatment. According to the XPS method, since the peak of the C—H bond overlaps with that of the C—C bond, they cannot be separated. However, since it can be seen that C—H bond is reduced by the hydrogen plasma treatment from the analyzed result of the FT-IR method shown in FIG. 7A, it is estimated that the peak of the C—C bond is increased.

Therefore, it can be found that when the hydrogen ion generated in the plasma is implanted in the resist by the hydrogen plasma treatment, the C—O bond in the resist is cut and C—C bond is increased (carbonated). From the analyzed result shown in FIG. 7B also, it can be found that the C—O bond is decreased by the hydrogen plasma treatment. Although the above result is provided regarding the resist, it can be easily considered that a hardened layer is formed by the reducing reaction in the lower organic film 3 similarly. In addition, although the above result regards the hydrogen plasma treatment, it can be applied to the plasma treatment using reducing gas such as hydrogen bromide or ammonia similarly.

FIG. 8 shows the relationship between a hardened layer thickness in the resist formed by the hydrogen plasma treatment and a high frequency power applied to the lower electrode 43. The layer thickness of the hardened layer shown in FIG. 8 has been calculated from observation of the section with a scanning electron microscope using the property that a modified layer formed in the resist by etching and the like is not dissolved by thinner (PGMEA (propylene glycol methyl ether acetate)). It is found that the layer thickness of the hardened layer shown in FIG. 8 is increased in proportion to the high frequency power (0% to 100%) applied to the lower electrode 43. FIG. 8 shows the layer thickness of the hardened layer by the hydrogen plasma treatment under the above condition and it is seen that the hardened layer having a thickness of 50 to 70 nm is formed.

The above relation is provided because the energy of the hydrogen ion implanted in the resist varies in accordance with the high frequency power applied to the lower electrode 43 and then the implanted depth of the hydrogen ion varies. Similarly, the layer quality or the depth of the hardened layer can be adjusted by varying the high frequency power applied to the upper electrode to vary the density of the hydrogen iron or varying a processing time to vary the implanted amount of the hydrogen ion. Here, the high frequency power to be applied and the processing time are the processing condition of the plasma treatment.

Then, after the hardening treatment for the lower organic film 3, the substrate 1 is taken out from the reaction chamber 41 of the plasma processing equipment and as shown in FIG. 5E, a middle layer 5 having a thickness of about 80 nm is formed on the lower organic film 3 and heat hardening treatment is performed through a heat treatment at 200 to 250° C. for 1 to 1.5 minutes. After FIG. 5E, as shown in FIG. 5F, the hardening treatment 4 such as the plasma treatment described above may also be performed for the middle layer 5.

Then, in FIG. 5G, a resist film for exposure is formed on the middle layer 5 and a resist pattern 6 having a desired pattern is formed using lithography. In FIG. 5H, the substrate 1 having a multilayer structure comprising the lower organic film 3, the middle layer 5 and the resist pattern 6 is transferred to the reaction chamber 41 of the plasma processing equipment shown in FIG. 4. Then, fluorocarbon gas is supplied from the gas inlets 46 to the reaction chamber 41 and after the pressure has been kept constant, the high frequency power is applied to the upper electrode 44 and the lower electrode 43 to generate plasma and the middle layer 5 is etched using the resist pattern 6 as a mask to transfer the pattern to the middle layer 5. The fluorocarbon gas includes $CF_4$, $CHF_3$, $CH_2F_3$ and $CH_3F$, and mixed gas of those fluorocarbon gases or mixed gas in which oxygen or nitrogen is added to the fluorocarbon gas may be used.

In FIG. 5H, after the fluorocarbon gas used in etching the middle layer 5 has been discharged from the reaction chamber 41 for a certain period of time, oxygen and carbon monoxide are supplied from the gas inlets 46 to the reaction chamber 41 continuously and the pressure is kept constant. Then, in FIG. 5I, the high frequency power is applied to the upper electrode 44 and the lower electrode 43 to generate plasma and the lower organic film 3 is etched using the laminated structure comprising the resist pattern 6 and the pattern of the middle layer 5 as a mask and the patterns are transferred to the lower organic film 3. In addition, at this time, the resist pattern 6 naturally disappears during the etching. The gas supplied to the reaction chamber 41 can be only oxygen, mixed gas in which nitrogen or argon is added to oxygen, or mixed gas of hydrogen and nitrogen, or ammonia.

Although the middle layer 5 and the lower organic film 3 are etched by the same plasma processing equipment in the above description, the etching of the middle layer 5 and the etching of the lower organic film 3 may be performed by different plasma processing equipments.

Then, in FIG. 5I, the substrate 1 having the laminated structure comprising the pattern of the middle layer 5 and the pattern of the lower organic film 3 is transferred to the reaction chamber 41 of the plasma processing equipment as shown in FIG. 4. Then, as shown in FIG. 5J, fluorocarbon gas is supplied to the reaction chamber 41, the pressure is kept constant and the high frequency power is applied to the upper electrode 44 and the lower electrode 43 to generate plasma, and the film to be processed 2 is etched using the laminated structure of the patterns of the middle layer 5 and the lower organic film 3 as a mask. At this time, the pattern of the middle layer 5 naturally disappears during the etching. Since the lower organic film 3 is hardened by the heat treatment in FIG. 5D, it is prevented from being deformed during the etching, so that a fine pattern can be transferred to the film to be processed 2 with high accuracy.

Then, in FIG. 5K, the lower organic film 3 remaining after the etching process for the film to be processed 2 is removed by a normal oxygen plasma treatment. Thus, a high-precision and fine pattern is formed in the film to be processed 2. In addition, when the plasma processing equipment shown in FIG. 4 is provided in a resist coating and developing apparatus used in normal photolithography, at least the series of processes from FIG. 5A to FIG. 5G can be performed in the same equipment. Such equipment is shown in FIGS. 9A to 9C.

Figure 9A:
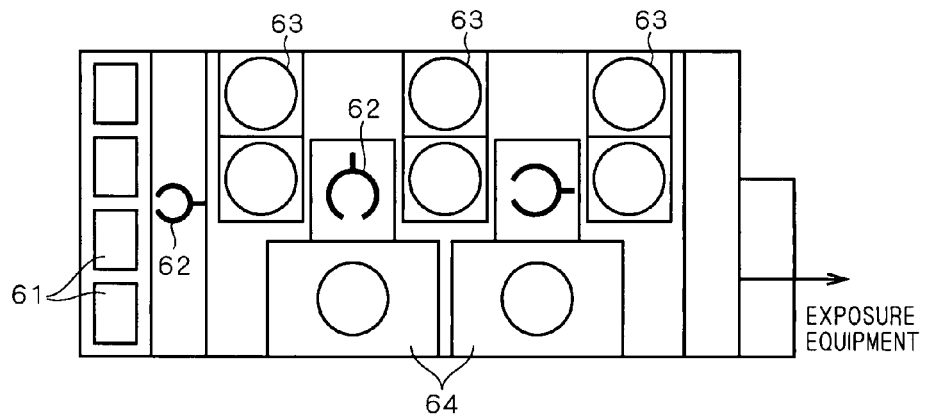
FIG. 9A to 9C are schematic views showing an equipment used in the manufacturing method of semiconductor device according to the embodiment 4 of the present invention.
Figure 9B:
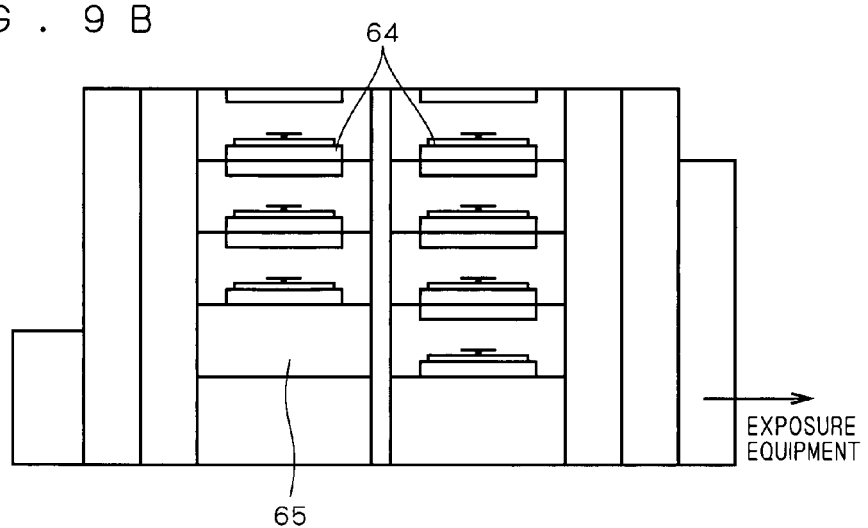
Figure 9C:
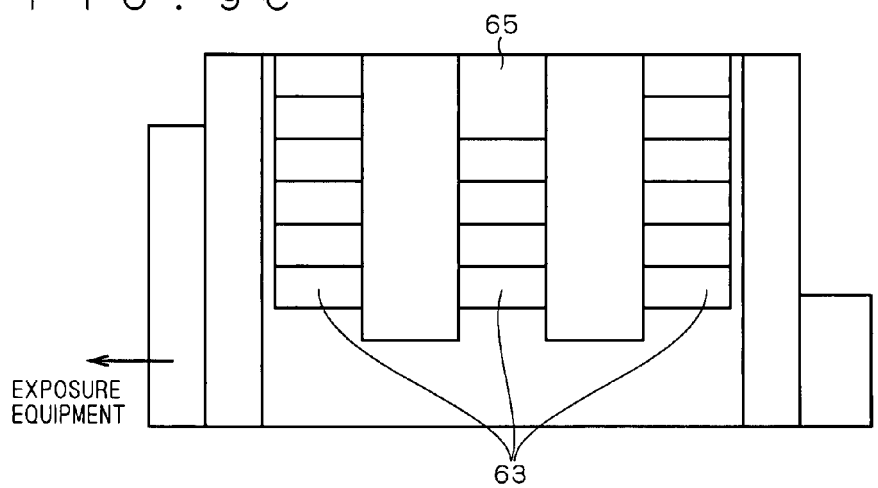

FIG. 9A is a top view of the equipment, FIG. 9B is a front view of the equipment, and FIG. 9C is a back view of the equipment. According to the process of the equipment shown in FIGS. 9A to 9C, a wafer housed in a cassette (not shown) is set on a cassette stage 61. The wafer on the cassette stage 61 is moved to a hot plate 63 by a carrier arm 62 and processed in a baking treatment on the hot plate 63. Then, the wafer is moved to an coating and developing cup 64 by the carrier arm 62. A predetermined material is applied to the wafer in the coating and developing cup 64. After the process in the coating and developing cup 64, the wafer is moved to the hot plate 63 by the carrier arm 62 and baked again. The equipment shown in FIGS. 9A to 9C processes the wafer as described above according to a recipe and carries it to an exposure equipment.

After exposed by the exposure equipment, the wafer is transferred to the equipment shown in FIGS. 9A to 9C and developed in the coating and developing cup 64 and baked again on the hot plate so that a series of patterning is performed. In addition, the equipment shown in FIGS. 9A to 9C has a structure in which the coating and developing cups 64 and the hot plates 63 are laminated on the front side and back side of the equipment, respectively, and the four coating and developing cups 64 are laminated and the six hot plates 63 are laminated in this equipment. Thus, according to the equipment shown in FIGS. 9A to 9C, the wafer is transported to each unit such as the hot plate 63 and the coating and developing cup 64 by the carrier arm 62.

In addition, as described in this embodiment, according to the equipment shown in FIGS. 9A to 9C, a hardening treatment unit 65 for performing the hardening treatment (plasma treatment or light irradiation treatment) is incorporated in a part of the laminated coating and developing cups 64 or hot plates 63. Therefore, the series of processes of the application, hardening and development described in this embodiment can be performed by the equipment shown in FIGS. 9A to 9C. In addition, the equipment shown FIGS. 9A to 9C is only an example and another constitution may be used as long as it has the same function.

Although the hardening treatment is performed for the lower organic film 3 and the middle layer 5 using the reducing plasma treatment in this embodiment, the hardening treatment may be performed through the ion implantation treatment using the implantation apparatus that carbonize (graphitize) the lower organic film 3 and improves the Si content in the middle layer 5, or DUV or VUV light irradiation or EB irradiation treatment that form the rigid crosslink constitution in the lower organic film 3 as shown in the embodiments 1 to 3.

Figure 10:
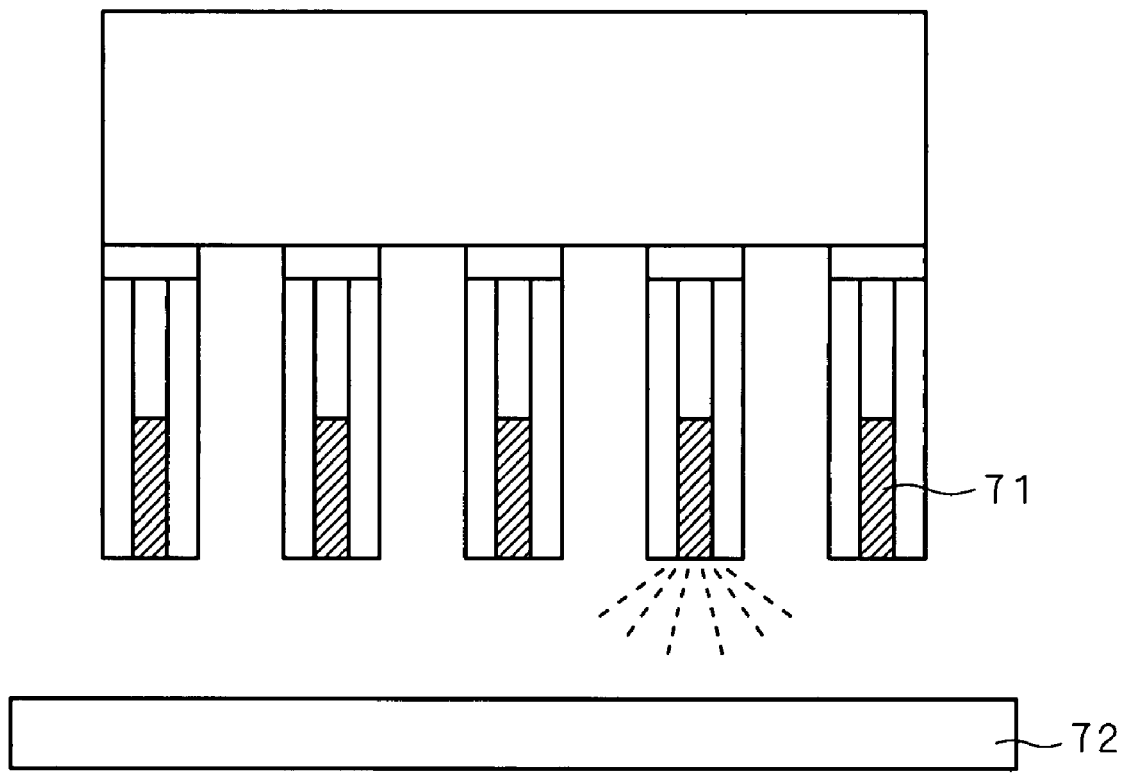
FIG. 10 is a schematic view showing an equipment used in a process by EB irradiation performed in the manufacturing method of semiconductor device according to the embodiment 4 of the present invention.

In addition, an equipment shown in FIG. 10 is used as the equipment for performing the EB irradiation treatment. According to the EB irradiation equipment shown in FIG. 10, a Si substrate 72 is arranged so as to be parallel to the surface on which a plurality of EB tubes 71 are mounted and EB shower is applied. When the equipment constitution shown in FIG. 10 is provided in the resist coating and developing apparatus used in the normal photolithography, the series of processes can be performed in the same apparatus. According to the DUV or VUV light irradiation equipment, although it is not shown, a light source that can select the wavelength of the light source is set on a temperature control type hot plate and the DUV or VUV light is applied while the temperature is controlled. When this equipment is provided in the resist coating and developing apparatus used in the normal photolithography, the series of the processes can be performed in the same apparatus.

Although the two-cycle excitation parallel plate type RIE apparatus is used as the plasma processing equipment in this embodiment, the present invention is not limited to this. For example, a plasma generator such as a parallel plate type, inductive coupling type, or ECR (Electron Cyclotron Resonance) type plasma generator that is used in normal dry etching, or a plasma processing equipment used for forming a plasma CVD film may be used.

Although the two-cycle excitation parallel plate type RIE apparatus is used in etching the middle layer 5 and the lower organic film 3 in this embodiment, the present invention is not limited to this. For example, a plasma generator such as a parallel plate type, inductive coupling type, or ECR (Electron Cyclotron Resonance) type plasma generator that is used in normal dry etching may be used.

Fifth Embodiment

First, regarding a method for forming a dual damascene structure on a substrate, a method for using a monolayer resist shown in FIGS. 11A to 11K and a method for using a multilayer resist shown in FIGS. 12A to 12K will be described as comparison examples in this embodiment.

Figure 11A:
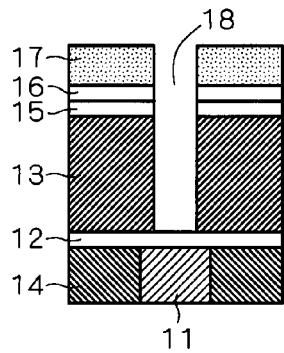

In FIGS. 11A and 12A, a liner film 12 and an interlayer insulation film 13 are formed on a lower Cu wiring layer 11. In addition, an insulation film 14 such as $SiO_2$ is formed in the horizontal direction of the Cu wiring layer 11. The liner film 12 is formed of SiCN, SiCO, SiC or $SI_3N_4$ that prevents Cu from diffusing and becomes a stopper for etching. The interlayer insulation film 13 comprises a low-dielectric film (Low-k film) formed of SiOCH or MSQ (methyl silsesquioxane) or formed of $SiO_2$ or SiOF. An uppermost layer 15 on the interlayer insulation film 13 may be formed of $SiO_2$ or $Si_3N_4$ to prevent the damage due to plasma or cleaning solution used in an ashing process and the like as a post-process.

According to FIG. 11A using the monolayer resist, a reflection preventing film 16 and a resist pattern 17 are laminated on the uppermost layer 15 on the interlayer insulation film 13. In FIG. 11A, the state after a via hole 18 has been etched using the resist pattern 17 as a mask is shown.

Figures 11B, 11C:
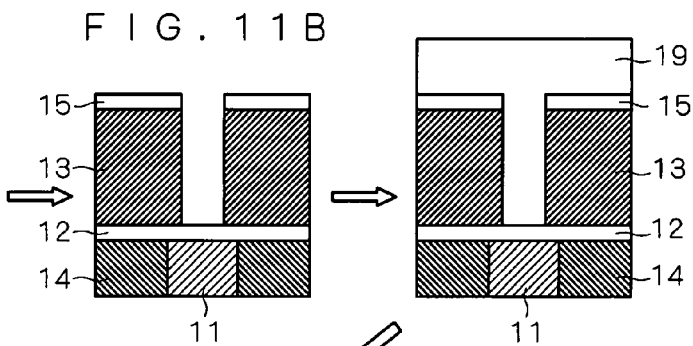
Figure 11D:
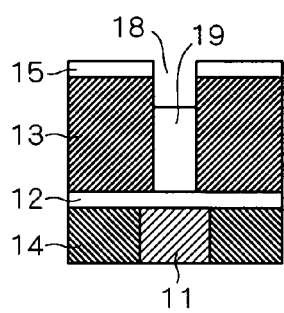
Figures 11E, 11F:
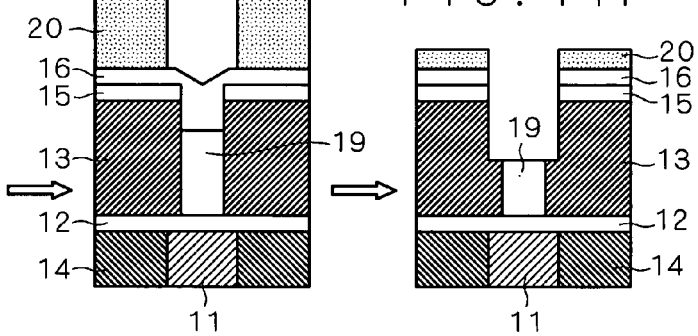
Figure 11G:
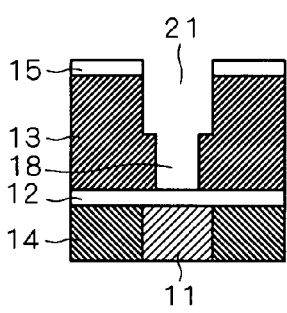

Then, in FIG. 11B, the remaining resist pattern 17 and the like after the etching is removed by ashing. Then, in FIG. 11C, a burying material 19 is applied to fill the via hole 18. In FIG. 11D, an etch back process is performed and the burying material 19 in the via hole 18 is partially removed. In FIG. 11E, a reflection preventing film 16 and a resist pattern 20 are formed. The resist pattern 20 forms a trench pattern using lithography.

Figures 11H, 11I:
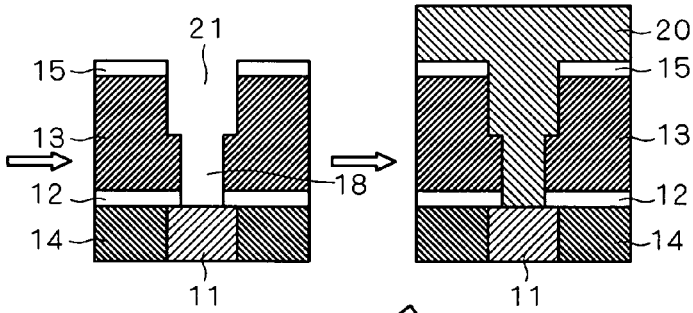
Figure 11J:
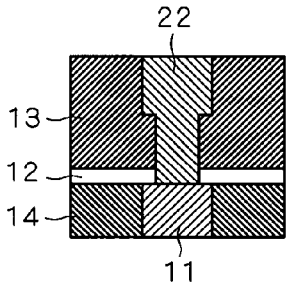
Figure 11K:
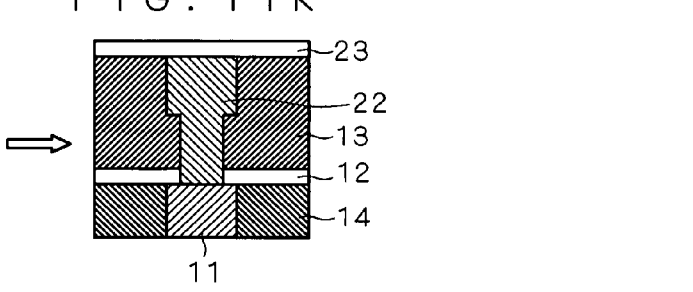

Then, in FIG. 11F, the interlayer insulation film 13 is etched using the resist pattern 20 as a mask to form a trench 21. Then, in FIG. 11G, the remaining reflection preventing film 16 and resist pattern 20 after etching are removed by ashing. Then, in FIG. 11H, the liner film 12 on the bottom of the via hole 18 is removed. In FIG. 11I, a Cu film 22 serving as a wiring layer material is formed by a plating process so as to fill the via hole 18 and the trench 21. In FIG. 11J, the material other than the Cu film 22 buried in the via hole 18 and the trench 21 is removed by CMP (Chemical Mechanical Polishing). Finally, in FIG. 11K, a $Si_3N_4$ film 23 is formed on the Cu film 22 and the interlayer insulation film 13 after CMP.

Meanwhile, in FIG. 12A using the multilayer resist, a lower organic film 25, a middle layer 26 and a resist pattern 17 are laminated on an uppermost layer 15 on an interlayer insulation film 13. In FIG. 12B, the middle layer 26 and the lower organic film 25 are etched (dry development) in a dry etching equipment using the resist pattern 17 in which a via hole pattern is formed using lithography, as a mask. Then, in FIG. 12B, the via hole 18 is etched using the middle layer 26 and the lower organic film 25 as a mask.

In FIG. 12C, the remaining lower organic film 25 is removed by ashing. Then, FIG. 12D, a lower organic film 27 and a middle layer 28 for forming a trench pattern are applied and processed by only a heat hardening treatment at about 200 to about 250° C., whereby a multilayer resist stack is formed. Then, a resist pattern 20 of the trench pattern is formed using photolithography.

When the liner film 12 formed of SiCN, SiCO, SiC or $Si_3N_4$ on the bottom of the via hole 18 is etched in forming the trench and exposed, a Cu wiring layer 11 is oxidized or corroded due to a chemical process such as ashing, etching or cleaning as a post-process, or a reaction with water in the air, so that abnormal growth and a void are generated and the wiring layer becomes nonconductive or high in resistance, causing the electric characteristics to deteriorate.

In order to prevent the above problems, the lower organic film 27 is provided in the via hole 18 as shown in FIG. 12D to prevent the Cu wiring layer 11 on the bottom of the via hole from being exposed by the etching when the trench is formed. Although a coating film that can be buried well is widely used for the material of the lower organic film 27, a carbon film ($\alpha$-C) formed by CVD is not suitable because its coverage characteristic are low.

Then, in FIG. 12E, the middle layer 28 and the lower organic film 27 are patterned by dry etching (dry development) using the resist pattern 20 as a mask. Then, in FIG. 12F, the interlayer insulation film 13 is etched using the patterned middles layer 28 and lower organic film 27 as a mask to form a trench 21.

Figure 13A:
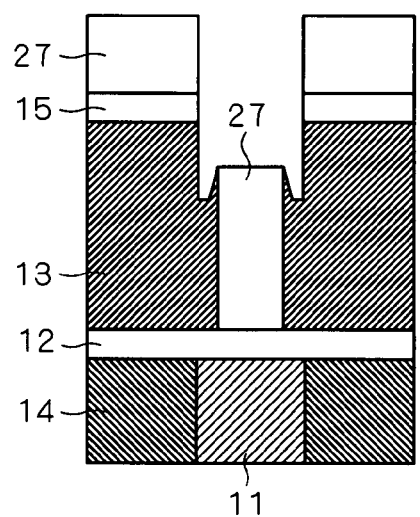
FIGS. 13A, 13B, 14A and 14B are views to explain a flow as a premise of the manufacturing method of the semiconductor device according to the embodiment 5 of the present invention.
Figure 13B:
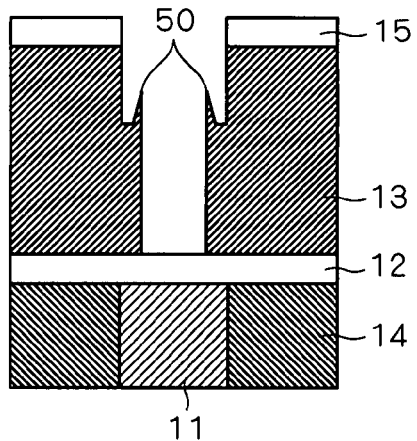

However, when the etching resistance of the lower organic film 27 in the via hole 18 is too high, since the interlayer insulation film 13 around the via hole 18 is not likely to be etched because the lower organic film 27 becomes a mask as shown in FIG. 13A, a part of it remains without being etched. This remaining part becomes an abnormal configuration called a crown-shaped fence configuration 50 as shown in FIG. 13B after ashing of the lower organic film 27. This fence configuration 50 becomes the source of a foreign substance and deteriorates coating coverage of the Cu barrier and seed as a post-process, causing electric characteristics or reliability to deteriorate.

In addition, since the lower organic film 27 having high etching resistance lowers the ashing speed, the ashing time is increased, which considerably damages the low-dielectric material (Low-k film) such as SiOCH of the interlayer insulation film 13, so that the dielectric coefficient is increased and the reliability deteriorates.

Figure 14A:
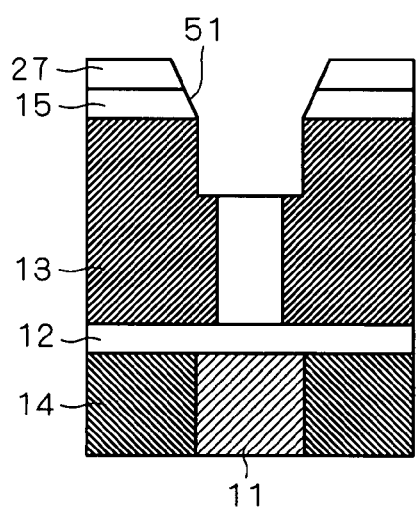
Figure 14B:
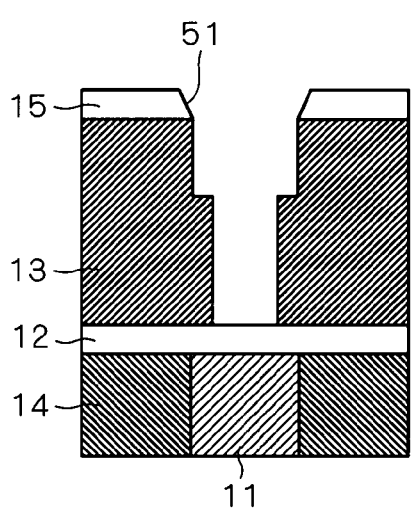

Meanwhile, when the etching resistance of the lower organic film 27 is low, although the generation of the fence configuration 50 and damage to the Low-k film can be prevented, since the resistance as a mask for etching is insufficient, an abnormal configuration 51 is caused in which the processed configuration deteriorates or pattern roughness (LER, LWR (line width roughness)) is generated due to the lack of remaining film of the mask as shown in FIGS. 14A and 14B.

Then, the remaining lower organic film 27 in FIG. 12F is removed in FIG. 12G. Then, in FIG. 12H, the liner film 12 on the bottom of the via hole 18 is removed. In FIG. 12I, a Cu film 22 serving as a wiring layer material is formed by a plating process so as to fill the via hole 18 and the trench 21. In FIG. 12J, the material other than the Cu film 22 buried in the via hole 18 and the trench 21 is removed by CMP (Chemical Mechanical Polishing). Finally, in FIG. 12K, a $Si_3N_4$ film 23 is formed on the Cu film 22 and the interlayer insulation film 13 after CMP.

As described above, when the dual damascene structure is formed, regarding the material of the lower organic film that is used in the trench etching step, while low etching speed (high etching resistance) is required at a part serving as the mask for the etching, high etching speed (low etching resistance) and high ashing speed are required at a part that is buried in the via hole, which is a tradeoff relation.

Thus, according to this embodiment, in addition to the normal heat hardening treatment, a hardening treatment using plasma, the implantation process or DUV or VUV irradiation is also performed for the lower organic film. According to the hardening treatment, as described in the embodiments 1 to 4, the etching resistance can be raised only at a part from its surface to a necessary depth by varying the process condition while the part buried in the via hole is not affected by the hardening treatment, so that the above tradeoff relation can be solved.

FIGS. 15A to 15L show the flowcharts of a method for forming the dual damascene structure according to this embodiment. In addition, in the processes shown by FIGS. 15A to 15L, the same sign is allotted to the same constitution in FIGS. 12A to 12K and its detailed description will be omitted in some cases.

Figure 15A:
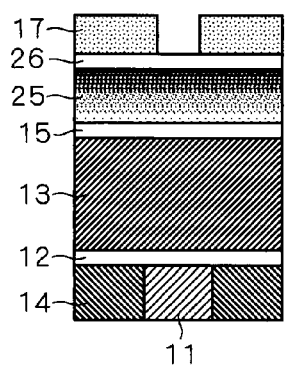
FIGS. 15A to 15L are flowcharts showing the manufacturing method of the semiconductor device according to the embodiment 5 of the present invention.
Figure 15B:
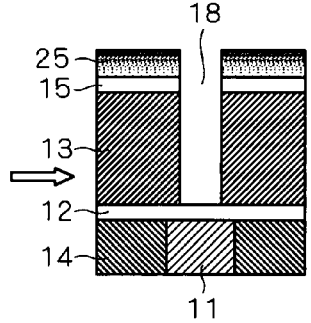

First, in FIG. 15A, a liner film 12 and an interlayer insulation film 13 are formed on a lower Cu wiring layer 11, and a resist pattern 17 of a via hole pattern is formed using lithography on a multilayer resist stack comprising a lower organic film 25 and a middle layer 26. In FIG. 15B, the middle layer 26 and the lower organic film 25 are etched (dry development) in a dry etching equipment using the resist pattern 17 as a mask. Then, a via hole 18 is etched using the middle layer 26 and the lower organic film 25 as a mask.

In addition, according to this embodiment, in order to improve the etching resistance at the surface part, the hardening treatment using hydrogen plasma is performed after the lower organic film 25 has been formed and the heat hardening treatment has been performed for it. Since the etching resistance of the lower organic film 25 can be raised by this hardening treatment, the etching selectivity is improved, so that the abnormal configuration such as penetration, deformation or roughness of the mask can be prevented. In addition, instead of the hardening treatment for the lower organic film 25, a lower organic film 25 having high etching resistance may be selected or a lower organic film 25 formed by CVD method may be used.

Figure 15C:
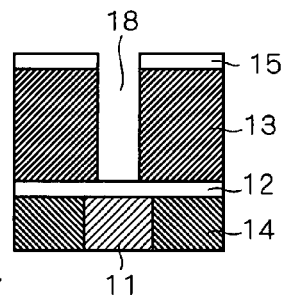
Figure 15D:
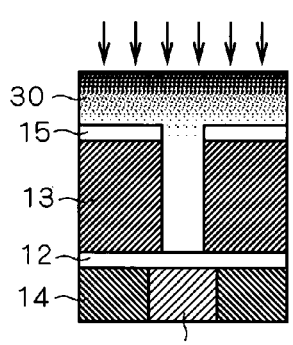

Then, after the lower organic film 25 has been removed by ashing in FIG. 15C, a lower organic film 30 comprising a material composition described in the embodiments 1 to 3 for forming the trench pattern and having a thickness of 300 to 450 nm is formed in FIG. 15D and only a heat hardening treatment is performed for it at about 200 to about 250° C. Then, according to this embodiment, the hardening treatment is performed using hydrogen plasma after the lower organic film 30 has been applied to improve the etching resistance at the surface part.

According to the hardening treatment using hydrogen plasma, the depth of a layer (hardened layer) modified from the lower organic film 30 can be controlled by controlling the process condition such as a plasma treatment pressure, plasma generation power, a bias power for drawing an ion, gas flow rate, and a stage temperature on which the wafer is set. In FIG. 15D, gradation is applied to show that the layer modified from the lower organic film 30 is formed from the surface to a certain depth.

According to this embodiment, it is preferable that the process condition of the hardening treatment is set such that only the part serving as the etching mask as the post-process is modified (hardened) and the lower organic film 30 buried in the via hole is not affected. For example, when the lower organic film 30 having a thickness of 300 to 450 nm is applied, the process condition of the hardening treatment is set such that the thickness of the modified layer may become 50 to 250 nm. In addition, in the hardening treatment, not only the plasma treatment using hydrogen plasma but also another plasma treatment using reducing gas, the ion implantation process, the DUV or VUV irradiation described in the embodiment 1 may be used, and as described in the embodiment 1, the thickness of the modified layer can be adjusted by varying the process conditions.

Figure 15E:
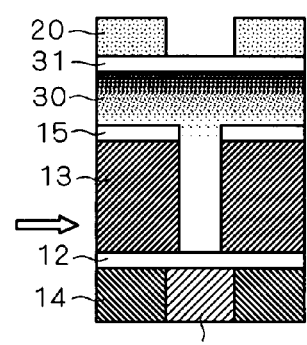

Then, as shown in FIG. 15E, a middle layer 31 having a thickness of 60 to 140 nm is applied and only a heat hardening treatment at about 200 to about 250° C. is performed for it. In addition, a multilayer resist stack is composed of the lower organic film 30 and the middle layer 31. Furthermore, a resist pattern 20 of a trench pattern is formed on the middle layer 31 using lithography. Here, instead of the middle layer 31 and the upper-layer resist pattern 20, patterning using a resist containing Si and silylation process may be performed.

Figure 15F:
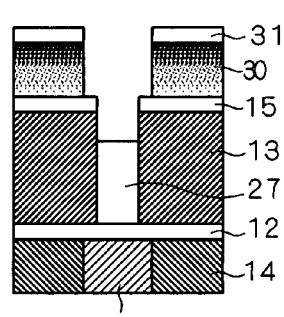
Figure 15G:
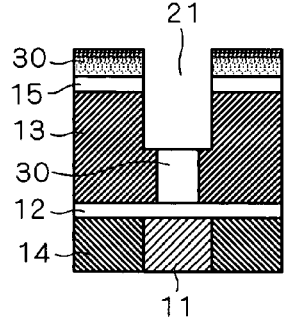
Figure 15H:
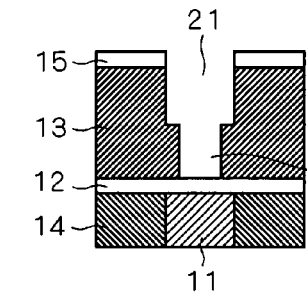
Figure 15I:
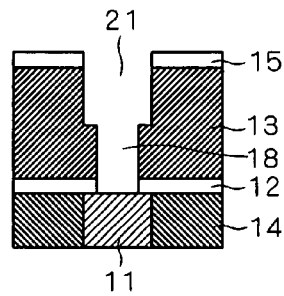
Figure 15J:
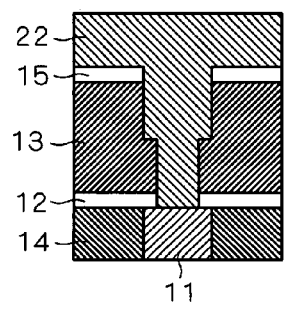
Figure 15K:
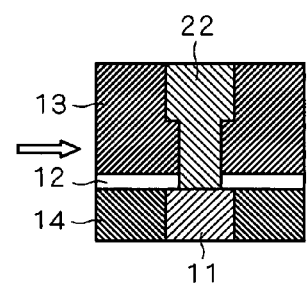
Figure 15L:
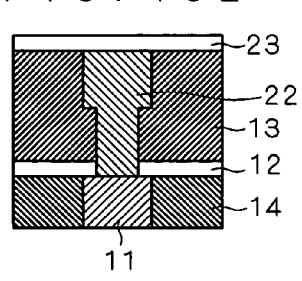
Figure 17A:
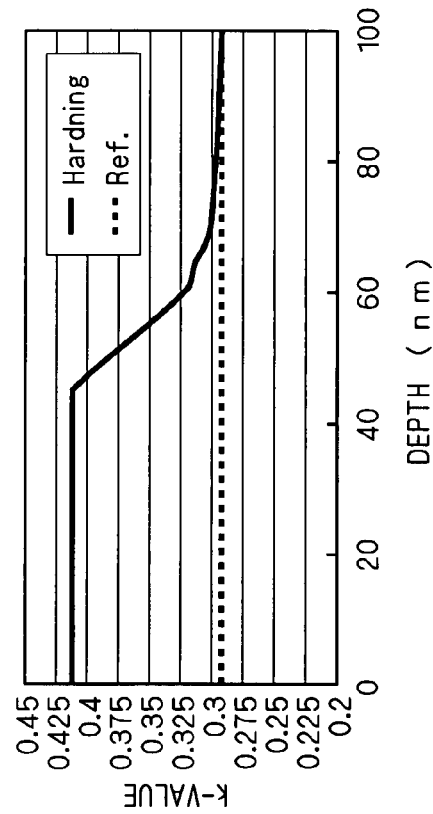
FIGS. 17A and 17B are views showing an optical constant of a lower organic film of the semiconductor device according to the embodiment 6 of the present invention.
Figure 17B:
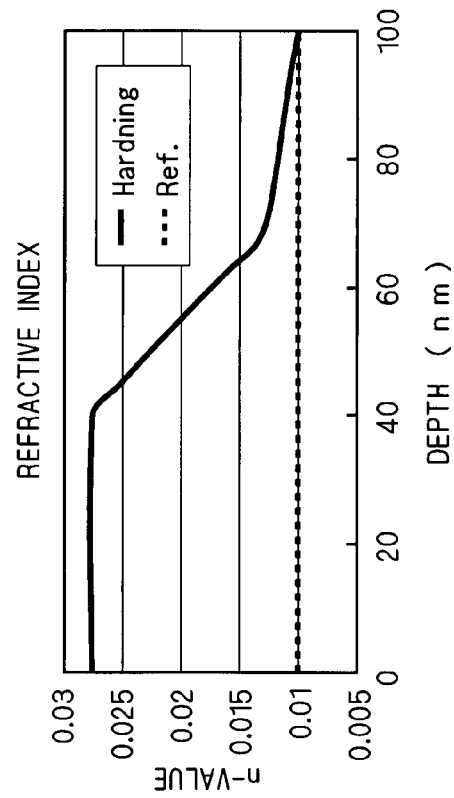

Then, in FIG. 15F, the middle layer 31 and the lower organic film 30 are patterned by dry etching (dry development) using the resist pattern 20 as a mask. In addition, the height of the lower organic film 30 in the via hole 18 is controlled by controlling an overetching time. Then, in FIG. 15G, a trench 21 is patterned by dry etching the interlayer insulation film 13 and the like using the patterned middle layer 31 and lower organic film 30 as a mask.

According to the lower organic film 30 serving as the mask, since the etching resistance is improved by the hardening treatment, the deterioration in processed configuration and pattern roughness due to the lack of the remaining film of the mask can be prevented. Meanwhile, since that hardening treatment does not affect the lower organic film 30 in the via hole 18, etching speed is high and the fence configuration 50 which is the abnormal configuration is prevented from being generated. Furthermore, since the lower organic film 30 in the via hole 18 is hardly affected by the hardening treatment, the ashing speed is high and the ashing time of the lower organic film 30 shown in FIG. 15H performed after the patterning of the trench 21 can be shortened, so that the damage to the Low-k material can be prevented. Here, the affect of the hardening treatment for the lower organic film 30 is different from that at the upper part of the lower organic film 30 and that at the lower organic film in the via hole 18. That is, the upper part of the lower organic film 30 is largely affected by the hardening treatment as compared with the lower organic film 30 in the via hole 18.

In addition, since the processes in FIGS. 15I to 15L are the same as those in FIGS. 12H to 12K, their description will be omitted.

Sixth Embodiment

A description will be made of the fact that the optical constant of the lower organic film gradually varies from the surface to depth direction by performing the hardening treatment to the lower organic film shown in FIG. 1 and the like. Although the lower organic film after the hardening treatment has a carbonized (graphitized) surface, its carbonized degree is reduced from the surface to the depth direction. Therefore, the optical constant gradually varies to the original optical constant of the applied film from the surface to the depth direction.

Figure 7A:
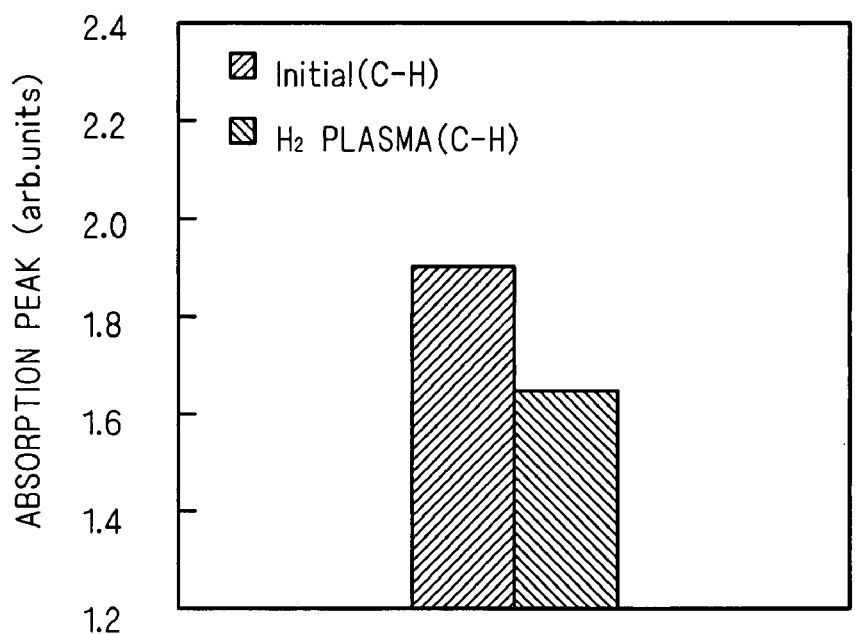
Figure 7B:
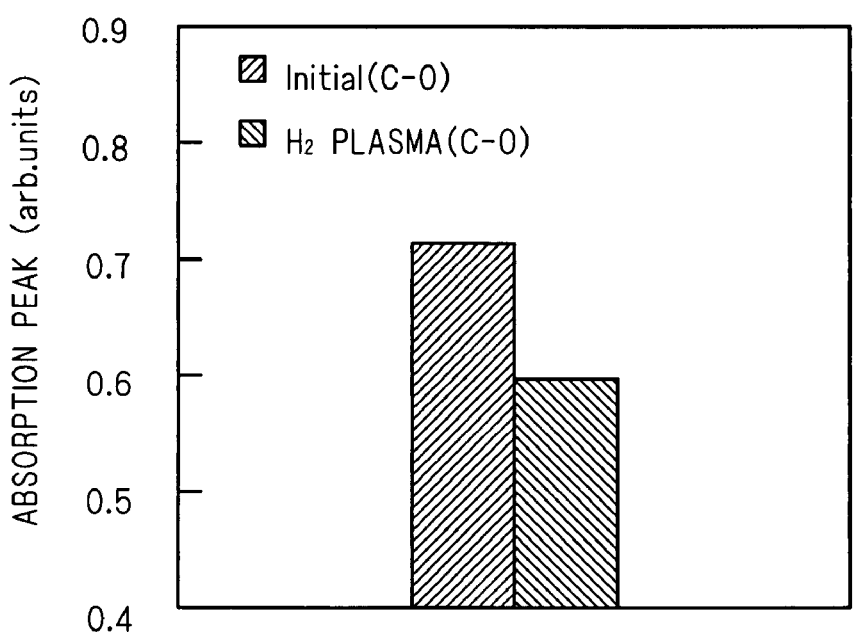

In this embodiment, the reflection coefficient from the interface between the resist and the middle layer has been calculated in the film constitution in FIG. 16 containing the lower organic film after the hardening treatment. In addition, the relationship between the optical constant (refractive index and absorbance index) and the depth from the surface of the lower organic film after the hardening treatment is shown in FIGS. 7A and 7B.

Figure 18A:
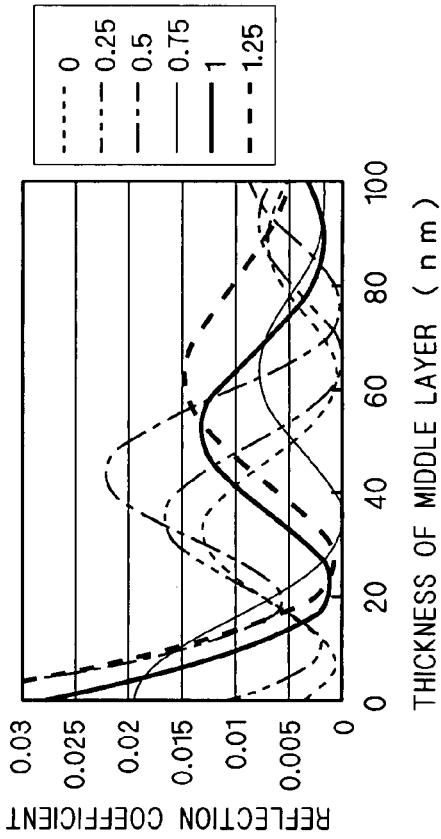
FIGS. 18A and 18B are views showing a reflection coefficient from the interface between a middle layer and a resist of the semiconductor device according to the embodiment 6 of the present invention.
Figure 18B:
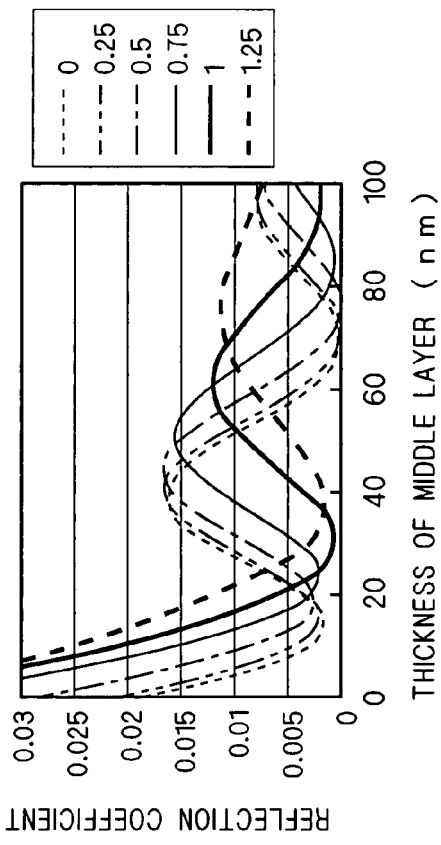

FIG. 18A shows a reflection coefficient from the interface between the resist and the middle layer in the film constitution shown in FIG. 16. In addition, FIG. 18B shows the reflection coefficient in the film constitution in FIG. 16 containing the lower organic film for which the hardening treatment is not performed as a reference. As can be seen from FIGS. 18A and 18B, in the case of the lower organic film in which its optical constant gradually varies by the hardening treatment, since there is no reflection interface having steep difference in refractive index while the light is absorbed, the light can be effectively absorbed in the lower organic film. Therefore, the reflection from the interface between the resist and the middle film that is important in the exposure step can be stable.

In addition, although the NA (aperture) of the exposure equipment ranges from 0 to 1.25 in FIGS. 18A and 18B, convergence (regularity) is higher in FIG. 18A containing the lower organic film for which the hardening treatment has been performed, which is advantageous in restricting the reflection coefficient to any incident angle (NA).

In addition, although it is not shown, when the hardening treatment is performed for the middle layer, the optical constant of the middle layer can gradually varies from the surface to the depth direction, so that the same effect can be provided.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device comprising:
    a processing mask layer forming step of forming a processing mask layer comprising at least one layer applied on a target layer and hardened by a heat hardening treatment, and performing hardening treatment for at least one layer in said processing mask layer;
    a processing mask layer etching step of applying a resist layer for exposure to said processing mask layer after the processing mask layer forming step, exposing and developing the resist layer to form a resist pattern, and etching said processing mask layer using said resist pattern as a mask; and
    a target layer etching step of etching said target layer using a pattern of said processing mask layer formed at said processing mask layer etching step as a mask, and wherein the hardening treatment uses an implantation process for implanting a predetermined atom, a reducing plasma treatment, or a treatment for applying UV or electron beam.

2. The manufacturing method of the semiconductor device according to claim 1, wherein
    said processing mask layer comprises only one organic layer applied and thermally hardened.

3. The manufacturing method of the semiconductor device according to claim 1, wherein
    said processing mask layer comprises a multilayer comprising a middle layer containing silicon oxide and an organic layer applied and thermally hardened.

4. The manufacturing method of the semiconductor device according to claim 3, wherein
    said middle layer forming step forms said middle layer by applying a silsesquoxane derivative polymer and thermally hardening the silsesquoxane derivative polymer.

5. The manufacturing method of the semiconductor device according to claim 1, wherein:
    said processing mask layer forming step applies a lower organic layer on said target layer and thermally hardens said lower organic layer, forms a middle layer containing silicon oxide on said lower organic layer, and performs the hardening treatment for at least one of said lower organic layer and said middle layer;
    said processing mask layer etching step etches said middle layer using said resist pattern as a mask and etches said lower organic layer using a pattern of said middle layer formed by etching as a mask; and
    said target layer etching step etches said target layer using the pattern of said lower organic formed at said processing mask layer etching step as a mask.

6. The manufacturing method of the semiconductor device according to claim 5, comprising a step of performing said hardening treatment for said lower organic layer after said lower organic layer has been formed.

7. The manufacturing method of the semiconductor device according to claim 5, comprising a step of performing said hardening treatment for at least one of said lower organic layer and said middle layer after said middle layer has been formed.

8. The manufacturing method of the semiconductor device according to claim 5, comprising a step of performing said hardening treatment for said lower organic layer after said lower organic layer has been formed, and a step of performing said hardening treatment for said middle layer after said middle layer has been formed.

9. The manufacturing method of the semiconductor device according to claim 5, wherein
    processes for forming said lower organic layer, forming said middle layer, and performing said hardening treatment using reducing plasma treatment or UV light irradiation treatment are sequentially performed in a same equipment.

10. The manufacturing method of the semiconductor device according to claim 1, wherein
    said reducing plasma treatment performs plasma treatment using hydrogen gas.

11. The manufacturing method of the semiconductor device according to claim 1, wherein the target layer includes a lower dielectric layer.

12. The manufacturing method of the semiconductor device according to claim 11, wherein
    said hardening treatment adjusts a thickness of a hardened layer by varying a process condition.

13. The manufacturing method of the semiconductor device according to claim 11, wherein
    said hardening treatment prevents reflection coefficient from a hardened layer to said resist pattern by varying a process condition.

14. The manufacturing method of the semiconductor device according to claim 1, wherein an upper portion of one layer in the processing mask layer is harder than a lower portion of one layer in the processing mask layer after the processing mask layer forming step.

15. The manufacturing method of the semiconductor device according to claim 14, wherein
said plasma treatment adjusts a thickness of a hardened layer by varying a high frequency power applied to a lower electrode as one process condition.

16. The manufacturing method of the semiconductor device according to claim 1, wherein a via hole is formed in the target layer before the processing mask layer forming step.

17. A manufacturing method of a semiconductor device forming a dual damascene structure on a semiconductor substrate comprising:
an opening step of opening a via hole in a low dielectric layer formed on a lower wiring layer;
a lower organic layer forming step of applying a lower organic layer on said low dielectric layer and burying said lower organic layer in said via hole;
a middle layer forming step of forming a middle layer containing silicon oxide on said lower organic layer;
a resist pattern forming step of applying a resist layer on the middle layer and exposing and developing the resist layer to form a resist pattern of a trench;
a middle layer etching step of etching said middle layer using said resist pattern as a mask;
a lower organic layer etching step of etching said lower organic layer using a pattern of said middle layer formed at said middle layer etching step as a mask;
a trench forming step of etching said low dielectric layer using a pattern of said lower organic layer formed at said lower organic layer etching step as a mask and forming said trench having a depth not reaching a bottom of said via hole; and
a wiring layer forming step of removing a film existing in said via hole on said lower wiring layer and burying a wiring layer material in said via hole and said trench, wherein
a hardening treatment is performed for at least one of said lower organic layer and said middle layer before the resist pattern forming step, and wherein the hardening treatment uses an implantation process for implanting a predetermined atom, a reducing plasma treatment, or a treatment for applying UV treatment or electron beam.

18. The manufacturing method of the semiconductor device according to claim 17, wherein
said hardening treatment hardens an upper part of said lower organic layer more than a part of said lower organic layer buried in said via hole by adjusting a process condition.

* * * * *